United States Patent
Lee et al.

(10) Patent No.: US 12,010,868 B2
(45) Date of Patent: Jun. 11, 2024

(54) DISPLAY DEVICE AND TOUCH DISPLAY DEVICE

(71) Applicant: LG Display Co., Ltd., Seoul (KR)

(72) Inventors: Keongjin Lee, Seoul (KR); Byungjoo Lee, Seoul (KR); Juhoon Jang, Paju-si (KR); Ara Yoon, Seoul (KR); Woonchan Moon, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 132 days.

(21) Appl. No.: 17/119,150

(22) Filed: Dec. 11, 2020

(65) Prior Publication Data

US 2021/0202917 A1    Jul. 1, 2021

(30) Foreign Application Priority Data

Dec. 30, 2019 (KR) .................. 10-2019-0178070

(51) Int. Cl.
| | |
|---|---|
| *H10K 50/858* | (2023.01) |
| *G06F 3/041* | (2006.01) |
| *G06F 3/044* | (2006.01) |
| *H10K 50/844* | (2023.01) |
| *H10K 59/122* | (2023.01) |
| *H10K 59/40* | (2023.01) |

(52) U.S. Cl.
CPC ......... *H10K 50/858* (2023.02); *G06F 3/0412* (2013.01); *G06F 3/0443* (2019.05); *G06F 3/0446* (2019.05); *H10K 50/844* (2023.02); *H10K 59/122* (2023.02); *H10K 59/40* (2023.02); *G06F 2203/04112* (2013.01)

(58) Field of Classification Search
CPC ............... H01L 27/3246; H01L 27/323; H01L 27/3223; H01L 51/5275; H01L 51/5253; G06F 3/0412; G06F 3/0446; G06F 3/0443; G06F 2203/04112; G06F 2203/041; H10K 50/858; H10K 50/844; H10K 59/40; H10K 59/122
USPC ..................................... 359/19; 345/76, 174
See application file for complete search history.

(56) References Cited

U.S. PATENT DOCUMENTS

| | | |
|---|---|---|
| 8,901,587 B2 | 12/2014 | Ohta |
| 8,963,138 B2 | 2/2015 | Lim et al. |
| 10,033,014 B2 | 7/2018 | Chen et al. |
| 10,224,377 B2 | 3/2019 | Park et al. |
| 10,516,140 B2 | 12/2019 | Chen et al. |
| 10,522,791 B2 | 12/2019 | Chen et al. |

(Continued)

FOREIGN PATENT DOCUMENTS

| | | |
|---|---|---|
| JP | 2003-59641 A | 2/2003 |
| JP | 2004-39500 A | 2/2004 |

(Continued)

*Primary Examiner* — Jimmy H Nguyen
(74) *Attorney, Agent, or Firm* — Birch, Stewart, Kolasch & Birch, LLP

(57) ABSTRACT

A display device includes a light emitting element layer, an intermediate layer disposed on the light emitting element layer, a lens layer having a convex shape and disposed on the intermediate layer to correspond to the light emitting element layer, and a lens protecting layer disposed on the intermediate layer and configured to cover the lens layer, wherein a total reflection of light output from a light emitting area of the light emitting element layer does not occur on an interface between the lens layer and the lens protecting layer.

17 Claims, 14 Drawing Sheets

(56) References Cited

U.S. PATENT DOCUMENTS

| | | | |
|---|---|---|---|
| 10,553,827 | B2 | 2/2020 | Jang et al. |
| 2010/0327304 | A1 | 12/2010 | Sonoda et al. |
| 2011/0057221 | A1 | 3/2011 | Sonoda |
| 2012/0127376 | A1 | 5/2012 | Shikina |
| 2013/0079460 | A1* | 3/2013 | Miyahara ............... C08F 220/26 524/544 |
| 2019/0131572 | A1* | 5/2019 | Gwon ................... G06F 3/0412 |
| 2019/0179466 | A1 | 6/2019 | Kim et al. |
| 2019/0221779 | A1* | 7/2019 | Jang ...................... H01L 27/323 |
| 2019/0339818 | A1 | 11/2019 | Rhe et al. |
| 2020/0083458 | A1 | 3/2020 | Jeon et al. |
| 2020/0119113 | A1* | 4/2020 | Lee ................... H10K 50/8445 |

FOREIGN PATENT DOCUMENTS

| | | | |
|---|---|---|---|
| JP | 2004-127662 | A | 4/2004 |
| JP | 2006-318807 | A | 11/2006 |
| JP | 2012-113951 | A | 6/2012 |
| JP | 2012-190628 | A | 10/2012 |
| KR | 10-2014-0109121 | A | 9/2014 |
| KR | 10-2016-0029087 | A | 3/2016 |
| KR | 10-2019-0069240 | A | 6/2019 |
| KR | 10-2019-0078989 | A | 7/2019 |
| KR | 10-2019-0086605 | A | 7/2019 |
| KR | 10-2019-0126601 | A | 11/2019 |

\* cited by examiner

DISPLAY DEVICE AND TOUCH DISPLAY DEVICE

CROSS-REFERENCE TO RELATED APPLICATION

This application claims priority to and the benefit of Korean Patent Application No. 10-2019-0178070, filed in the Republic of Korea on Dec. 30, 2019, the entire contents of which are hereby expressly incorporated by reference into the present application.

BACKGROUND

1. Field

The present disclosure relates to a display device and a touch display device that can ensure improved light extraction efficiency and improved central luminance.

2. Background

With advances in technologies for display devices, various types of display devices such as a liquid crystal display (LCD) device, an organic light emitting display (OLED) device and the like have been developed.

As smart phones have become ubiquitous in recent years, display devices such as a touch display device, to which a new input method is applied, have been widely distributed.

The touch display devices denote a device that can perform not only a function of displaying a moving image or an image but also a touch-based input function such that a touch display device is operated by a touch of a user's finger or a pen.

SUMMARY

Since a touch display device provided with a new input means performs a key function of displaying a moving image or an image like a display device, improved luminance efficiency of the touch display device can result in improved performance of the touch display device.

As smart phones are frequently used in outdoor space thanks to its mobility, improved luminance efficiency is one of key factors of a touch display device as well as an ordinary display device to enhance visibility in outdoor space.

In case a large amount of light is totally reflected and lost in a display device without escaping out of the display device among light rays output from a light emitting area of the display device, luminance of a display device and a touch display device can be reduced as a whole.

As a means to solve or address the above-described problems, Applicant of the present disclosure has devised a display device and a touch display device capable of ensuring improved light extraction efficiency and improved central luminance.

Accordingly, the present disclosure is directed to a display device and a touch display device that can ensure improved light extraction efficiency.

The present disclosure is also directed to a display device and a touch display device that can concentrate light, output from a light emitting area, on a center as much as possible, thereby ensuring improved central luminance.

The present disclosure is also directed to a display device and a touch display device that can ensure improved light extraction efficiency, can ensure improved central luminance and can derive a height of the lens layer, where processing is possible.

Aspects of the present disclosure are not limited to the above-described ones. Additionally, other aspects and advantages that have not been mentioned can be clearly understood from the following description and can be more clearly understood from the following embodiments. Further, it will be understood that the aspects and advantages of the present disclosure can be realized via means and combinations thereof that are described in the appended claims.

According to an aspect of an embodiment, a display device and a touch display device can ensure improved light extraction efficiency and improved central luminance.

According to an aspect of an embodiment, a display device can comprise a light emitting element layer, an intermediate layer disposed on the light emitting element layer, a lens layer having a convex shape and disposed on the intermediate layer to correspond to the light emitting element layer, and a lens protecting layer disposed on the intermediate layer and configured to cover the lens layer, wherein the total reflection of light output from a light emitting area of the light emitting element layer does not occur on an interface between the lens layer and the lens protecting layer.

In this case, the total reflection of light output from an edge point of the light emitting area does not occur on the interface between the lens layer and the lens protecting layer.

The light emitting element layer can be disposed inside the lens layer, and a diameter (D) of the lens layer is larger than a length (a) of the light emitting area, and a refractive index of the lens layer can be higher than a refractive index of the lens protecting layer and a refractive index of the intermediate layer.

The intermediate layer comprises at least one organic layer and at least one inorganic layer.

Light output from the light emitting area is primarily refracted on an interface between the intermediate layer and the lens layer, and the primarily refracted light is secondarily refracted on the interface between the lens layer and the lens protecting layer, an incident angle of the primarily refracted light on the interface between the lens layer and the lens protecting layer is $\theta_i$, and in the case of $\theta_i < \sin^{-1}(n_2/n_1)$, the total reflection does not occur. In the inequality equation above, $n_1$ is a refractive index of the lens layer, and $n_2$ is a refractive index of the lens protecting layer.

According to an aspect of an embodiment, a touch display device comprises a base substrate comprising a display area and a non-display area, a plurality of light emitting element layers disposed in the display area, an intermediate layer disposed to cover the plurality of light emitting element layers, a plurality of touch electrodes having a mesh shape and disposed on the intermediate layer, a plurality of lens layers having a convex shape and disposed inside the touch electrode while being disposed on the intermediate layer, and a lens protecting layer disposed on the intermediate layer and configured to cover the lens layer, wherein total reflection of light output from a light emitting area of the light emitting element layer does not occur on the interface between the lens layer and the lens protecting layer.

According to the present disclosure, total reflection of all light rays output from a light emitting area may not occur on an interface between a convexly shaped lens layer and a lens protecting layer, thereby minimizing deterioration of light output efficiency, which is caused by total reflection, and ensuring improved light extraction efficiency of a display device.

According to the present disclosure, while high light extraction efficiency is ensured, light that spreads out at main viewing angles can concentrate on a center as much as possible, thereby ensuring improved central luminance.

According to the present disclosure, a radius of curvature of the lens layer can be optimized, thereby ensuring improved light extraction efficiency, ensuring improved central luminance and deriving a height of the lens layer, where processing is possible.

Detailed effects of the present disclosure are described together with the above-described effects in the detailed description of the disclosure.

BRIEF DESCRIPTION OF THE DRAWINGS

The accompanying drawings constitute a part of this specification, illustrate one or more embodiments of the present disclosure, and together with the specification, explain the present disclosure, wherein.

DETAILED DESCRIPTION OF THE EMBODIMENTS

Figure 1:
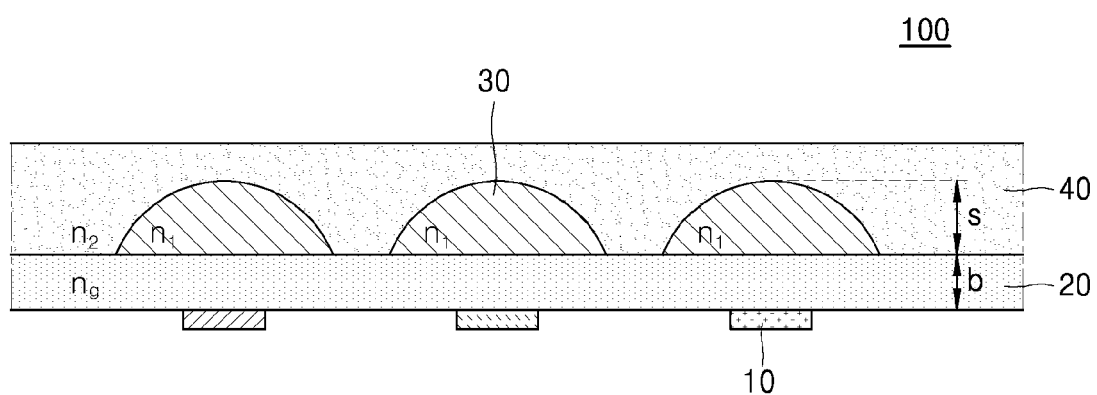
FIG. 1 is a cross-sectional view schematically illustrating a display device according to an aspect of an embodiment.

The above-described aspects, features and advantages are specifically described with reference to the accompanying drawings hereunder such that one having ordinary skill in the art to which the present disclosure pertains can easily implement the technical spirit of the disclosure. During description in the disclosure, detailed description of known technologies in relation to the disclosure is omitted if it is deemed to make the gist of the present disclosure unnecessarily vague. Below, preferred embodiments according to the disclosure are described with reference to the accompanying drawings. Throughout the drawings, identical reference numerals denote identical or similar components.

When any component is described as being "at an upper portion (or a lower portion) of a component" or "on (or under)" a component, any component can be placed on the upper surface (or the lower surface) of the component, and an additional component can be interposed between the component and any component placed on (or under) the component.

In describing the components of the disclosure, when any one component is described as being "connected," "coupled" or "connected" to another component, the component can be directly connected or can be able to be directly connected to another component; however, it is also to be understood that an additional component can be "interposed" between the two components, or the two components can be "connected", "coupled" or "connected" through an additional component.

Below, a display device according to aspects of some embodiments is described with reference to FIG. 1. All the components of the display device according to all embodiments of the present disclosure are operatively coupled and configured.

Referring to FIG. 1, a display device 100 according to an aspect of an embodiment can comprise a light emitting element layer 10, an intermediate layer 20 on the light emitting element layer 10, a convexly shaped lens layer 30 disposed on the intermediate layer 20 and configured to correspond to the light emitting element layer 10, and a lens protecting layer 40 disposed on the intermediate layer 20 and configured to cover the lens layer 30.

In this case, total reflection of light output from a light emitting area of the light emitting element layer 10 does not occur on an interface (e.g., at the interface) between the lens layer 30 and the lend protecting layer 40.

The display device 100 according to the present disclosure, for example, can be implemented as an organic light emitting display (OLED) device but not be limited. The display device 100 can be implemented as various types of flat panel display devices 100 such as a liquid crystal display (LCD) device 100 and the like and can also be implemented as a touch display device 100.

In the specification, an organic light emitting element layer that uses an organic light emitting element as a light emitting element is provided as an example of the light emitting element layer 10 but is not limited to this example.

The organic light emitting element layer can comprise a first electrode, an organic light emitting layer, a second electrode and a bank layer. Each organic light emitting layer can comprise a hole transporting layer, a light emitting layer (an organic light emitting layer) and an electron transporting layer. In this case, when a voltage is supplied to the first electrode and the second electrode, a hole and an electron can move to the light emitting layer respectively through the hole transporting layer and the electron transporting layer, and can be coupled to each other in the light emitting layer to emit light.

The organic light emitting layer can comprise a white light emitting layer that emits white light. In this case, a color filter can be additionally formed over the organic light emitting layer. The organic light emitting layer can also comprise a red light emitting layer that emits red light, a green light emitting layer that emits green light, or a blue light emitting layer that emits blue light.

The light emitting area of the light emitting element layer 10 can denote an area where light is output from the light emitting element layer 10. For example, in case the light emitting element is implemented as an organic light emitting element, the area can be an area where the first electrode, the organic light emitting layer and the second electrode overlap, and an area corresponding to an opening of the bank layer that serves as a pixel defining film defining pixels.

The intermediate layer 20, which comprises at least one organic layer and at least one inorganic layer, can comprise all layers disposed between the light emitting element layer 10 and the lens layer 30. For example, the intermediate layer 20 does not necessarily denote a layer comprising a single layer. The intermediate layer 20 can denote a layer comprising a plurality of layers between the light emitting element layer 10 and the lens layer 30.

The intermediate layer 20, for example, can comprise an encapsulation layer that prevents air or moisture from infiltrating into the light emitting element layer 10. In this case, the encapsulation layer can comprise at least one organic encapsulation film. For example, the encapsulation layer can comprise a first inorganic encapsulation film, an organic encapsulation film and a second inorganic encapsulation film.

The intermediate layer 20 can further comprise various types of functional layers such as a buffer layer or an insulation layer.

The lens layer 30 can be formed into a convex lens shape. The lens layer 30 can be disposed at a position corresponding to the light emitting element layer 10 such that the light emitting element layer 10 is disposed inside the lens layer 30.

A diameter (D) of the lens layer 30 can be larger than a length (a) of the light emitting area (light emitting area of pixel) of the light emitting element layer 10. Accordingly, the lens layer 30 can be configured to overlay a front of the light emitting element layer 10.

In case the light emitting element layer 10 comprises light emitting areas of different sizes based on colors such as a red light emitting layer that emits red light, a green light emitting layer that emits green light, or a blue light emitting layer that emits blue light, the lens layers 30 of different colors corresponding to the light emitting element layers can have different diameters.

The lens layer 30 can be made of low-temperature photo acrylic (PAC) materials that can be manufactured through a low-temperature process at 100 degrees Celsius or lower but not be limited. The lens layer 30, for example, can comprise polytriazine or a material where one or more of titanium dioxide ($TiO_2$), zirconium dioxide ($ZrO_2$) and a nano filler is added to polytriazine.

In the present disclosure, the lens layer 30 can be formed through an exposure process to have a convex shape.

A refractive index (m) of the lens layer 30 can be higher than a refractive index ($n_g$) of the intermediate layer. Accordingly, light can be refracted in an inward direction of the lens layer 30 on the interface between the lens layer 30 and the intermediate layer 20. The refractive index ($n_g$) of the intermediate layer 20 denotes a refractive index of a layer comprising all the plurality of layers between the light emitting element layer 10 and the lens layer 30. Due to a difference in the refractive indices, light output from the light emitting area can be primarily refracted on the interface between the intermediate layer 20 and the lens layer 30.

The lens protecting layer 40 on the intermediate layer 20 can be disposed on the lens layer 30 to cover the lens layer 30. For example, the lens protecting layer 40 is configured to cover the lens layer 30 while the lens layer 30 and the lens protecting layer 40 can all be configured to have an interface that contacts the intermediate layer 20. Accordingly, the lens layer 30 can be disposed between the intermediate layer 20 and the lens protecting layer 40 in an area where the lens layer 30 and the lens protecting layer 40 overlap. Thus, in the area where the lens layer 30 and the lens protecting layer 40 overlap, a bottom surface of the lens layer 30 can have an interface that contacts the intermediate layer 20, and a top surface, i.e., a curved surface, of the lens layer 30 can have an interface that contacts the lens protecting layer 40.

The lens protecting layer 40 can comprise a material in which a hydroxyl group (—OH group) or a fluorine group (—F) is added to a substituent of an epoxy resin or an acryl resin, or a material in which a nano-sized hollow silica is added to an epoxy resin or an acryl resin.

A refractive index ($n_1$) of the lens layer 30 can be higher than a refractive index ($n_2$) of the lens protecting layer 40 such that light is refracted respectively on the interface between the intermediate layer 20 and the lens layer 30, and on the interface between the lens layer 30 and the lens protecting layer 40. For example, light output from the light emitting area can be primarily refracted on the interface between the intermediate layer 20 and the lens layer 30, and the primarily refracted light is secondarily refracted on the interface between the lens layer 30 and the lens protecting layer 40.

In an embodiment of the present disclosure, a display device 100 that satisfies the following requirements is provided such that total reflection of all light rays output from the light emitting area does not occur on the interface between the convexly shaped lens layer 30 and the lens protecting layer 40.

In case total reflection of light output from an edge point of the light emitting area does not occur on the interface between the lens layer 30 and the lens protecting layer 40, total reflection of all the light rays output from all the points of the light emitting area does not occur on the interface between the lens layer 30 and the lens protecting layer 40.

In case a condition of $\theta_i < \sin^{-1}(n_2/n_1)$ is satisfied when an incident angle of the primarily refracted light on the interface between the lens layer 30 and the lens protecting layer 40 is $\theta_i$, total reflection does not occur on the interface between the lens layer 30 and the lens protecting layer 40.

For example, in an embodiment of the disclosure, the incident angle ($\theta_i$) of the primarily refracted light on the interface between the lens layer 30 and the lens protecting layer 40 can be adjusted to satisfy the condition of $\theta_i < \sin^{-1}(n_2/n_1)$, such that total reflection does not occur on the interface between the lens layer 30 and the lens protecting layer 40.

In the inequality $\theta_i < \sin^{-1}(n_2/n_1)$, $n_1$ denotes a refractive index (an index of refraction) of the lens layer 30, and $n_2$ denotes a refractive index of the lens protecting layer 40.

The equation for the condition where total reflection does not occur, as described above, can be acquired using the following equations.

With respect to a coordinate $p_o(0, 0)$ of an origin point (origin point of lens) of the lens layer 30, a coordinate of the edge point of the light emitting area (light emitting area edge point of pixel) of the light emitting element layer 10 can be defined as $p_p(x_p, y_p)$, and a coordinate of a point, where light output from the coordinate $p_p(x_p, y_p)$ is primarily refracted on the interface between the intermediate layer 20 and the lens layer 30, can be defined as $p_g(x_g, y_g)$, and a coordinate of a point, where the primarily refracted light is secondarily refracted on the interface between the lens layer 30 and the lens protecting layer 40, can be defined as $p_l(x_l, y_l)$.

For example, the coordinate $p_o$ denotes an origin point (origin point of lens) of the lens layer 30, and $p_p$ denotes an edge point (light emitting area edge point of pixel) of the light emitting area of the light emitting element layer 10.

The coordinate $p_g$ denotes a point where light output from the light emitting area of the light emitting element layer 10 meets the interface between the lens layer 30 and the intermediate layer 20.

The coordinate $p_l$ can be defined as a point where light output from the light emitting area of the light emitting element layer 10 is primarily refracted on the interface between the lens layer 30 and the intermediate layer 20 and where the primarily refracted light meets the interface between the lens protecting layer 40 and the lens layer 30.

In this case, an equation $$x_p = \frac{a}{2}$$

is satisfied, and an equation $y_p = y_l - b$ is satisfied.

Additionally, an equation $$x_g = \frac{y_g - (y_p - x_p \tan(90 - \theta_p))}{\tan(90 - \theta_p)}$$

is satisfied, and an equation $y_g = y_p + b$ is satisfied.

Further, an equation $x_l = \sqrt{2RS - S^2}$ is satisfied, and an equation $y_l = R - S$ is satisfied.

In the above-described equation, @, denotes an incident angle of light output from the coordinate $p_p(x_p, y_p)$ on the interface between the intermediate layer 20 and the lens layer 30.

An incident angle denotes an angle between a normal line, which is perpendicular to an interface formed by points where light meets an interface of two mediums when the light proceeds from one medium to another medium, and the light incident to the interface. Additionally, the incident angle can denote an angle between a line, which is perpendicular to a surface of a point where light is reflected when the light is reflected from the surface, and the incident light.

In the coordinate, a denotes a length of the light emitting area of the light emitting element layer 10, and in the equation $x_l = \sqrt{2RS - S^2}$, R denotes a radius of curvature of the lens layer 30 and S denotes height of the lens layer 30.

In the coordinate, g denotes a height of the intermediate layer 20, and g can be defined as an optical gap that denotes a gap between the light emitting element layer 10 and the lens layer 30.

Additionally, a coordinate of a point, where a virtual extension line of the primarily refracted light meets a lower interface of the intermediate layer 20, is defined as $p'_g(x'_p, y'_p)$, and in the coordinate $p'_g(x'_p, y'_p)$, $p'_g$ is defined as a point where a virtual extension line of light refracted on the coordinate $p_g$ meets the lower interface of the intermediate layer 20.

In this case, an equation $\theta_r = \theta_n - \theta'_p$, is satisfied, and in the equation, $\theta_i$ denotes an incident angle of light output from $p_g$.

Further, an equation $\theta_n = \tan^{-1}(x_l/y_l)$ is satisfied, an equation $\theta'_p = \tan^{-1}((x_l - x'_p)/(y_l - y'_p))$ is satisfied, an equation $$x'_p = \sqrt{\left(\frac{n_g}{n_1}\right)^2 ((x_p - x_g)^2 + b^2) - b^2} + x_g$$

is satisfied, and an equation $y'_p = y_p$ is satisfied.

Specifically, the equation $$x'_p = \sqrt{\left(\frac{n_g}{n_1}\right)^2 ((x_p - x_g)^2 + b^2) - b^2} + x_g$$

can be derived through a process of building the following equations, considering $n_g$ that is a refractive index of the intermediate layer 20 and considering c that is speed of light.

In the case of $$\frac{\sqrt{(x'_p - x_g)^2 + b^2}}{c/n_1} = \frac{\sqrt{(x_p - x_g)^2 + b^2}}{c/n_g},$$

an equation $n_1 \sqrt{(x'_p - x_g)^2 + b^2} = n_g \sqrt{(x_p - x_g)^2 + b^2}$ can be built, and through the process of building an equation $$(x'_p - x_g)^2 + b^2 = \left(\frac{n_g}{n_1}\right)^2 ((x_p - x_g)^2 + b^2),$$

an equation $$x'_p = \sqrt{\left(\frac{n_g}{n_1}\right)^2 ((x_p - x_g)^2 + b^2) - b^2} + x_g$$

can be finally derived.

A refractive angle of the secondarily refracted light on the interface between the lens layer 30 and the lens protecting layer 40 is defined as an equation $\theta_r = \sin^{-1}(n_1/n_2 \sin \theta_i)$. The refractive angle denotes an angle formed between light refracted on an $n_2$ interface and a normal line on the interface when the light proceeds from one medium to another medium.

Light having a specific angle at an edge point of the light emitting area of the light emitting element layer 10 and proceeding to the lens layer 30 can be refracted or totally reflected.

However, according to an aspect of an embodiment, when the condition $\theta_i < \sin^{-1}(n_2/n_1)$ is satisfied, total reflection of light may not occur on the interface between the lens layer 30 and the lens protecting layer 40, which is a curved interface of the lens layer 30.

The radius of curvature of the lens layer 30 can be adjusted such that total reflection of light output from the light emitting area does not occur on the curved interface of the lens layer 30, thereby minimizing deterioration of light output efficiency, which is caused by total reflection of the display device 100.

Figure 2:
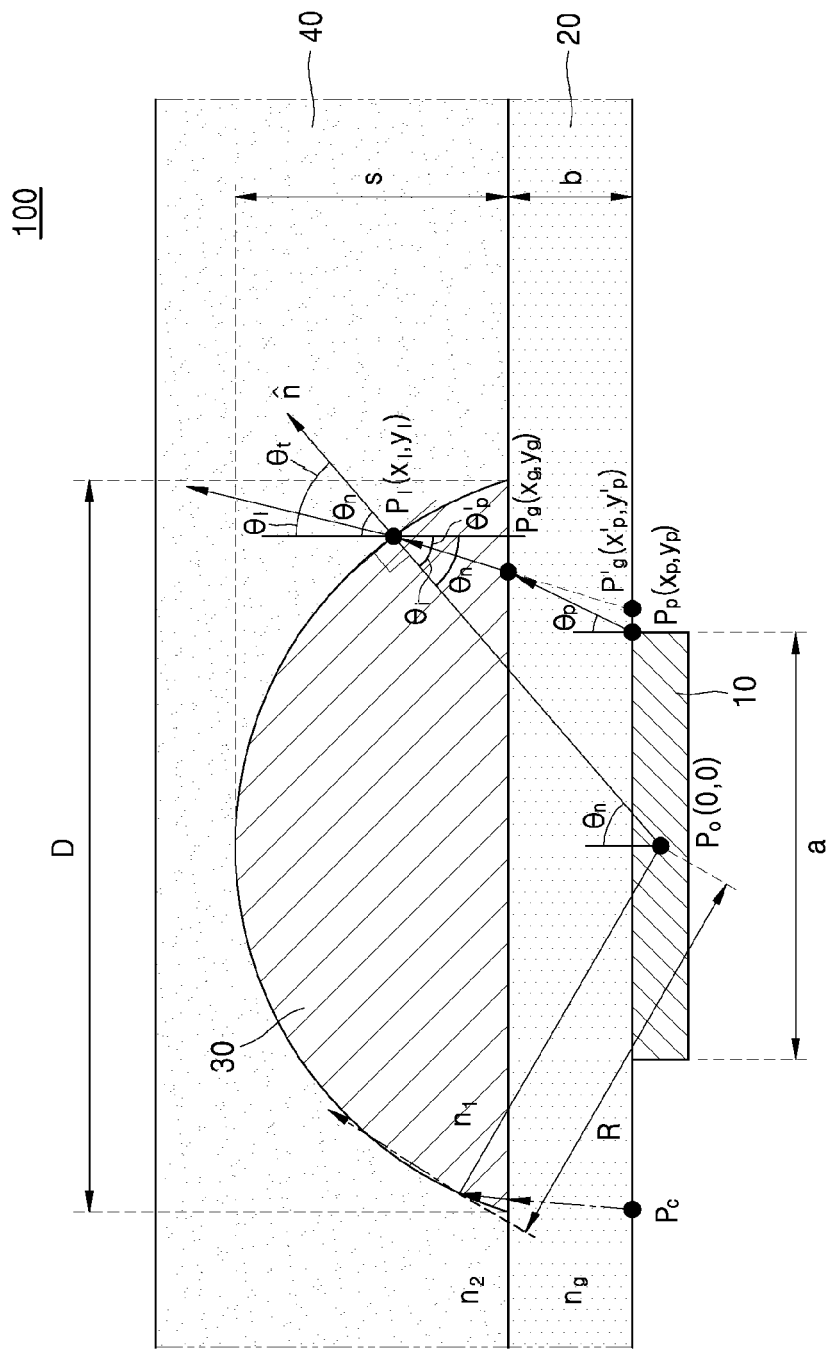
FIG. 2 is an enlarged cross-sectional view schematically illustrating a single light emitting area of a display device according to an aspect of an embodiment.

In the present disclosure, the conditions where total reflection does not occur denote that total reflection of light of the light emitting area does not occur on the curved interface of the lens layer 30. As illustrated in FIG. 2, total reflection ($P_c$) of light output from other areas except the light emitting area can occur on the curved interface of the lens layer 30.

For example, according to the present disclosure, the radius of curvature of the lens layer 30 can be adjusted to prevent total reflection of light output from the light emitting area from occurring on the curved interface of the lens layer 30. Light extraction efficiency and light concentration efficiency can vary depending on a change in radii of curvature of a lens.

Figure 3:
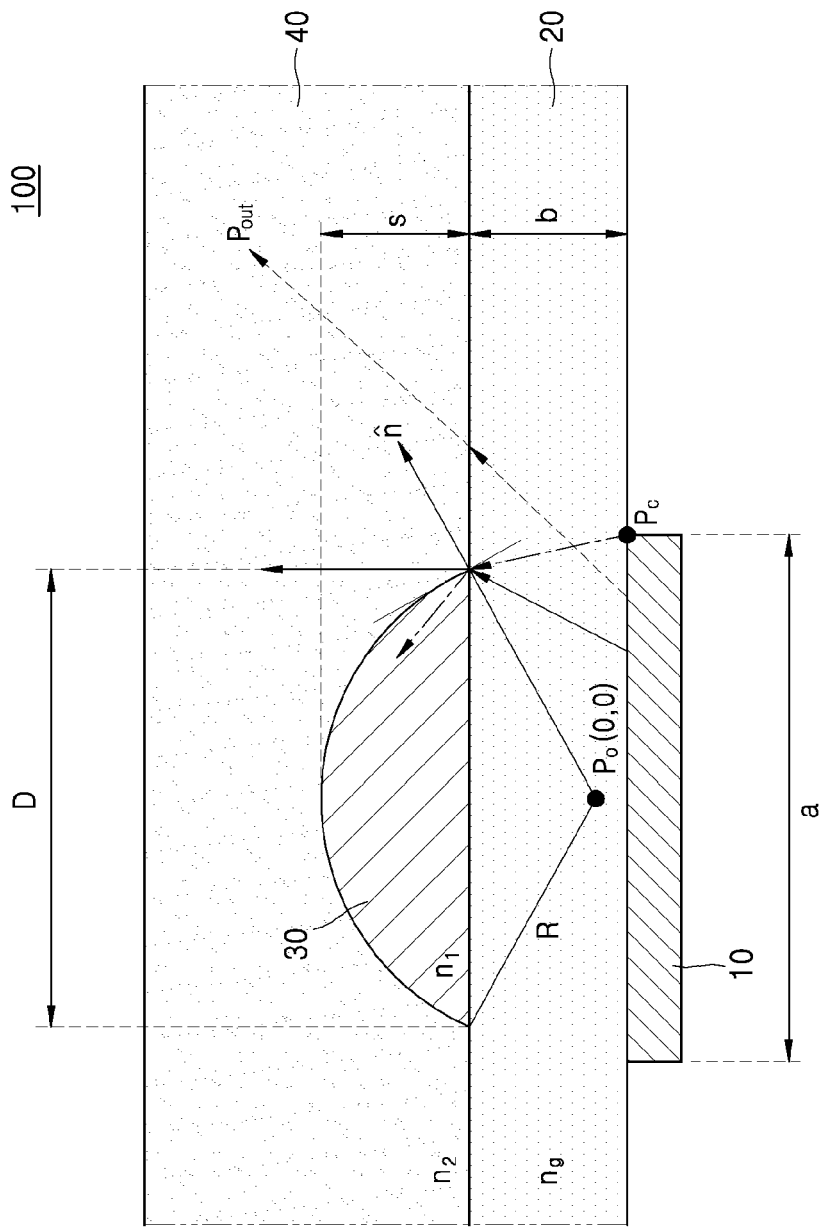
FIGS. 3 and 4 are views illustrating a relationship between light extraction efficiency and light concentration efficiency on the basis of a change in surface areas and radii of curvature of a lens.

For example, in case a diameter (D) of the lens layer 30 is smaller than a length (a) of the light emitting area of the light emitting element layer 10 as illustrated in FIG. 3, the radius of curvature (R) of the lens layer 30 decreases. Accordingly, optical power of a lens can increase, and high light concentration efficiency can be ensured. In this case, the optical power can be defined as Optical Power=1/f, and can be acquired through an equation $$f = R\left(\frac{n_g}{n_1 - n_2}\right).$$

For example, as in the above equation for acquiring optical power, the optical power is inversely proportional to the radius of curvature of the lens.

Thus, in case the diameter (D) of the lens layer 30 is smaller than the length (a) of the light emitting area of the light emitting element layer 10 as illustrated in FIG. 3, optical power of a lens can increase and light concentration efficiency can increase, but an entire surface area of the lens can be reduced. Accordingly, a plurality of light rays (Pout) can be emitted outwards without passing through the lens layer 30, and light extraction efficiency can be degraded.

Figure 4:
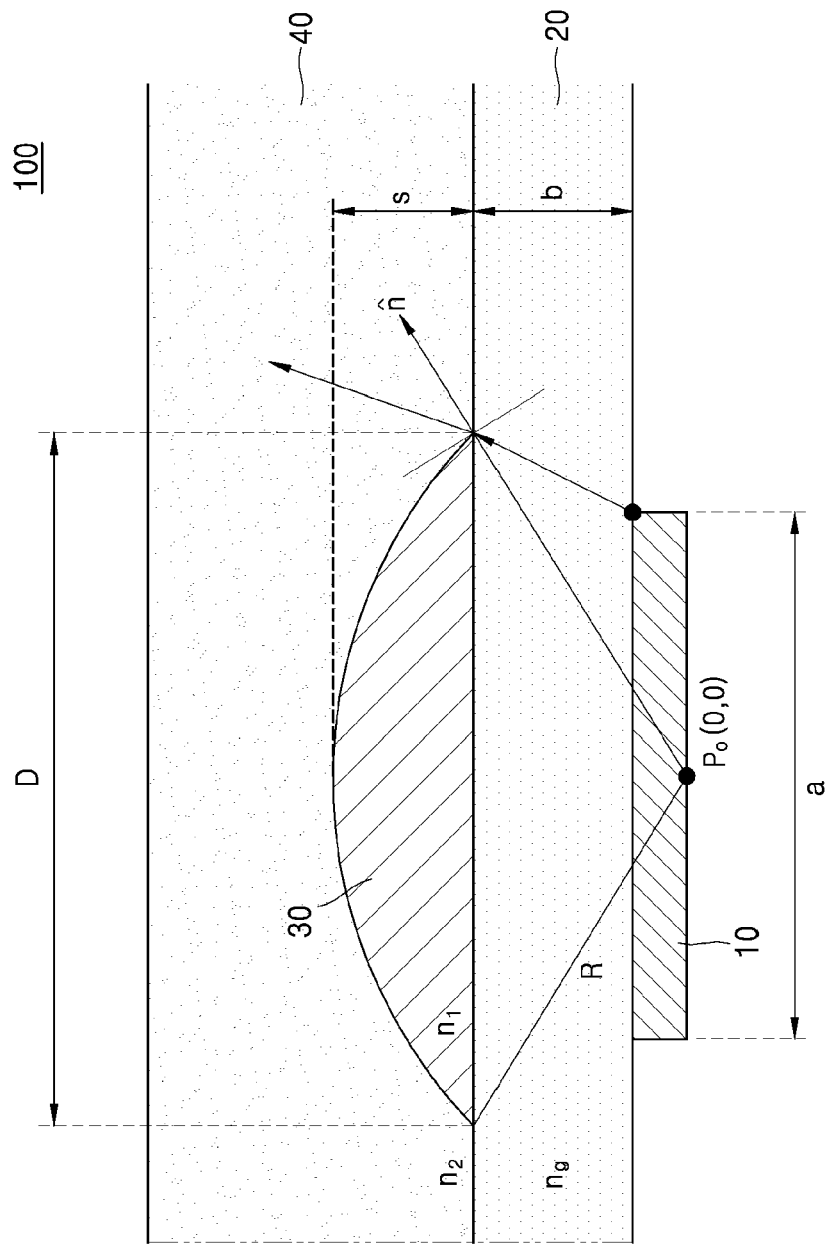

In case the diameter (D) of the lens layer 30 is larger than the length (a) of the light emitting area of the light emitting element layer 10 as illustrated in FIG. 4, an entire surface area of the lens can increase. Accordingly, light rays (Pout) emitted outwards without passing through the lens layer 30 can significantly decrease, and light extraction efficiency can increase.

However, the radius of curvature (R) of the lens can increase, and optical power of the lens can decrease, thereby causing a reduction in light concentration efficiency.

In an embodiment of the present disclosure, total reflection of all the light rays output from the light emitting area can be prevented on the interface between the convexly shaped lens layer 30 and the lens protecting layer 40, and the radius of curvature of the lens layer 30 can be optimized such that light extraction efficiency of the display device 100 is improved while deterioration of light output efficiency, caused by total reflection, is minimized.

For example, according to the present disclosure, high light extraction efficiency can be ensured, and light spread out at main viewing angles can be concentrated on a center as much as possible, thereby ensuring improvement in central luminance.

Additionally, according to the present disclosure, the radius curvature of the lens layer 30 can be optimized such that a height of the lens layer 30, at which processing is possible, is derived while light extraction efficiency is improved and central luminance is improved.

To minimize light rays that are totally reflected and lost in the display device 100, a lens having a diameter that is as large as possible is required. To form the lens having a large diameter, the lens also has to have a high height. However, manufacturing the lens with a high height entails problems such as a large amount of costs incurred for raw materials, deterioration in safe processing, and difficulty in formation of a convexly shaped lens and the like. It is not easy to solve the above-described problems.

According to the present disclosure, the radius of curvature of the lens layer 30 is optimized without increasing a size of the lens, to improve light extraction efficiency. Accordingly, light extraction efficiency can be improved, central luminance can be improved, and a height of the lens layer 30, at which a convexly shaped lens can be formed, can be derived considering safety in processing.

Figure 5:
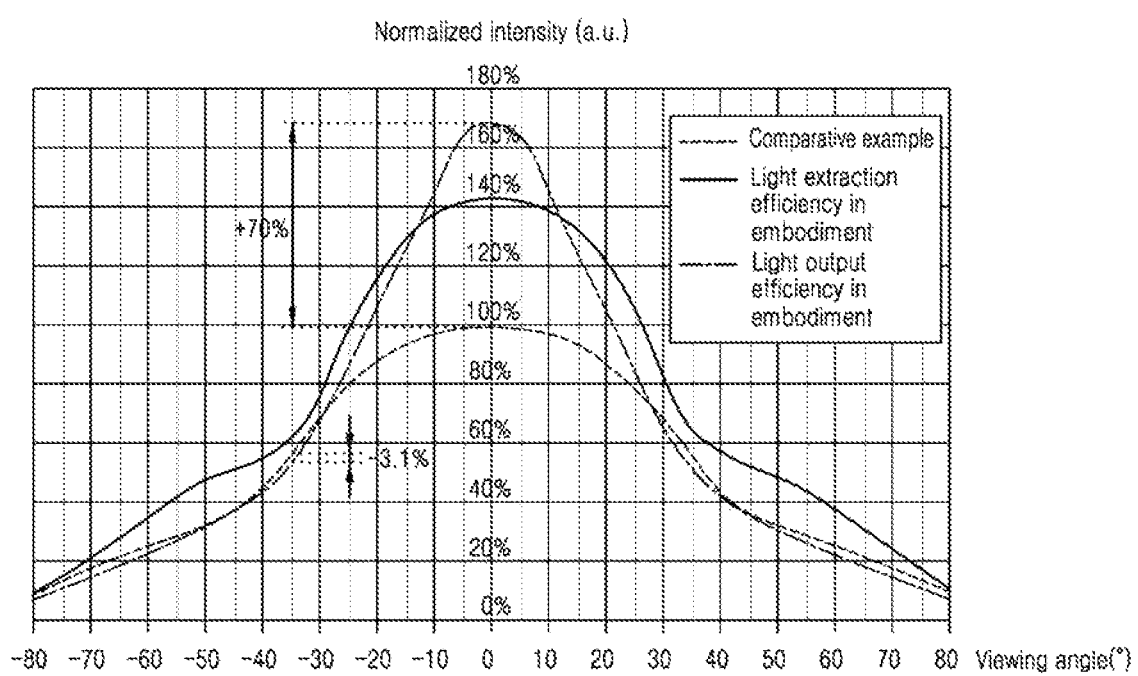
FIG. 5 shows a result of measurement of normalized intensity of light on the basis of viewing angles in a comparative example and an embodiment.

FIG. 5 shows a result of measurement of normalized intensity of light on the basis of viewing angels in a comparative example and an embodiment.

In the comparative example where a display device is not provided with an additional lens layer 30, normalized intensity of light was measured, and in the embodiment where a display device is provided with the lens layer 30 to prevent total reflection on the interface between the lens layer 30 and the lens protecting layer 40, light extraction efficiency and light output efficiency were measured.

The results of measurement in FIG. 5 indicate that light extraction efficiency in the embodiment is higher than that of the comparative example, at almost all viewing angles.

Additionally, the results of measurement in FIG. 5 indicate that intensity of light significantly increases at a central portion regarding light output efficiency and that an increase in front luminance results in an increase in light output efficiency.

However, light extraction efficiency of the embodiment is 3.1% lower than that of the comparative example at some of the viewing angles, but light output efficiency of the embodiment is 70% higher than that of the comparative example at central viewing angles, which is a significant increase. For example, according to the present disclosure, luminance of a central portion noticeably increases.

Figure 6:
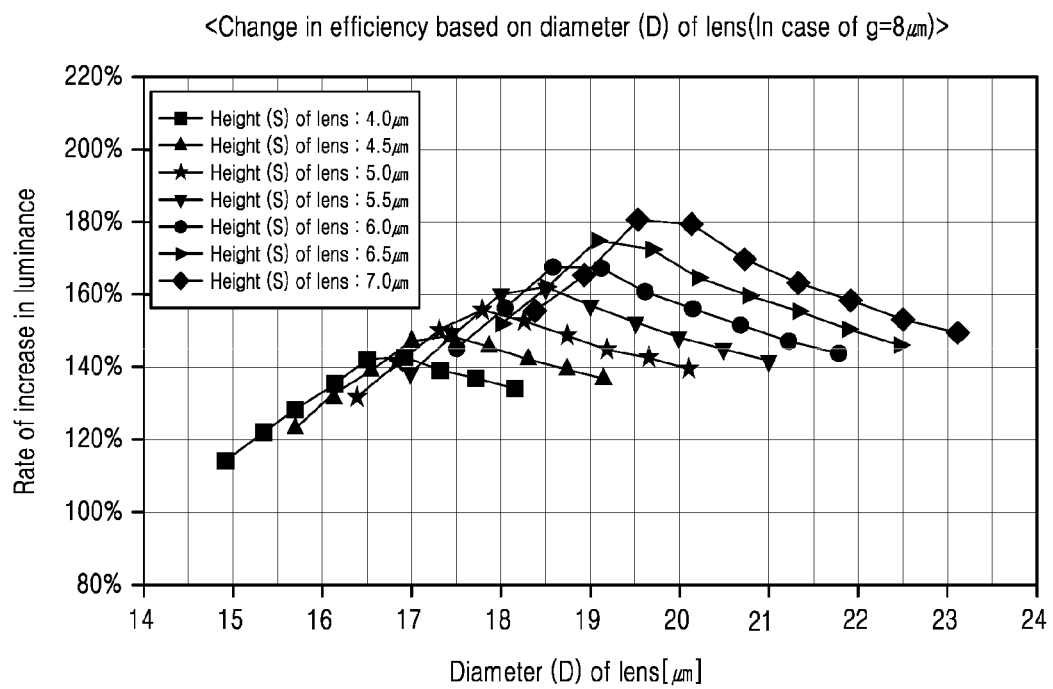
FIGS. 6 to 8 are views illustrating a change in rates of increase in luminance on the basis of a diameter of a lens.
Figure 7:
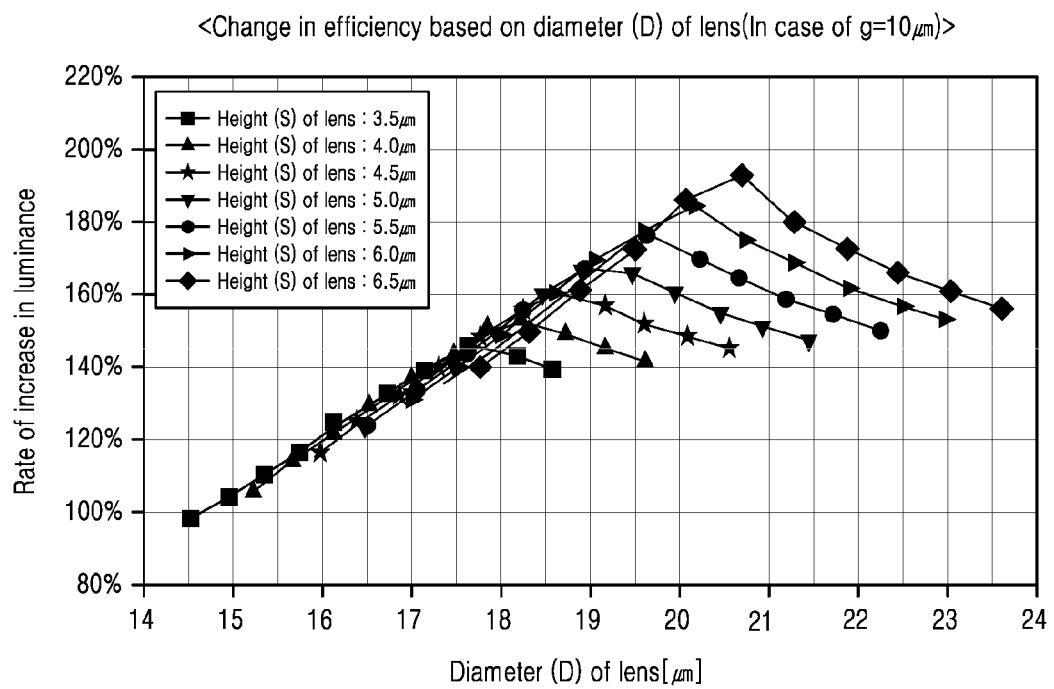
Figure 8:
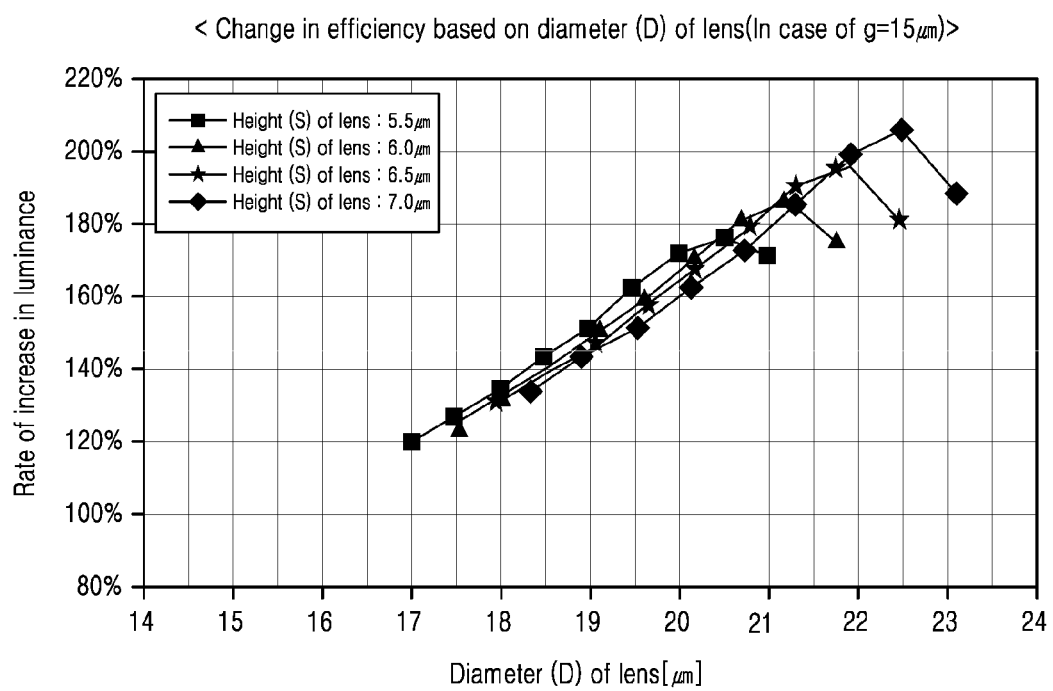

FIGS. 6 to 8 are views illustrating a change in rates of increase in luminance on the basis of a diameter of a lens, which is measured respectively on the basis of heights of the intermediate layer 20.

In this case, the change in rates of an increase in luminance was monitored on the basis of a length (15 μm) of the light emitting area, a refractive index ($n_1$: 1.67) of the lens layer 30, and a refractive index ($n_2$: 1.42) of the lens protecting layer 40.

FIG. 6 illustrates a ratio of an increase in luminance to a change in diameters (D) of a lens with respect to a height (8 μm) of the intermediate layer 20. As illustrated in FIG. 6, as a diameter (D) of the lens increases, luminance also increases. However, as a diameter of the lens increases above a certain level or higher, optical power of the lens decreases and a rate of increase in luminance also decreases.

Further, FIG. 6 shows that optical power of the lens increases and luminance also increases as a height of the lens increases.

FIGS. 7 and 8 illustrate a rate of increase in luminance based on a change in diameters (D) of the lens with respect to a height (respectively 10 μm and 15 μm) of the intermediate layer 20. As illustrated in FIG. 6, as a diameter (D) of the lens increases, luminance also increases. However, as a diameter of the lens increases above a certain level or higher, optical power of the lens decreases and a rate of increase in luminance also decreases.

FIGS. 7 and 8 show that optical power of the lens increases and luminance also increases as a height of the lens increases.

For example, according to the present disclosure, the conditions, where luminance is highest, are determined on the basis of a change in various conditions such as a diameter (D) of the lens, a height (S) of the lens, a height (b) of the intermediate layer 20 and the like. The present disclosure is directed to a display device that can have high light extraction efficiency and can concentrate light spread out at main viewing angles at a center as much as possible, on the basis of the suggested conditions, thereby ensuring improved central luminance.

Figure 9:
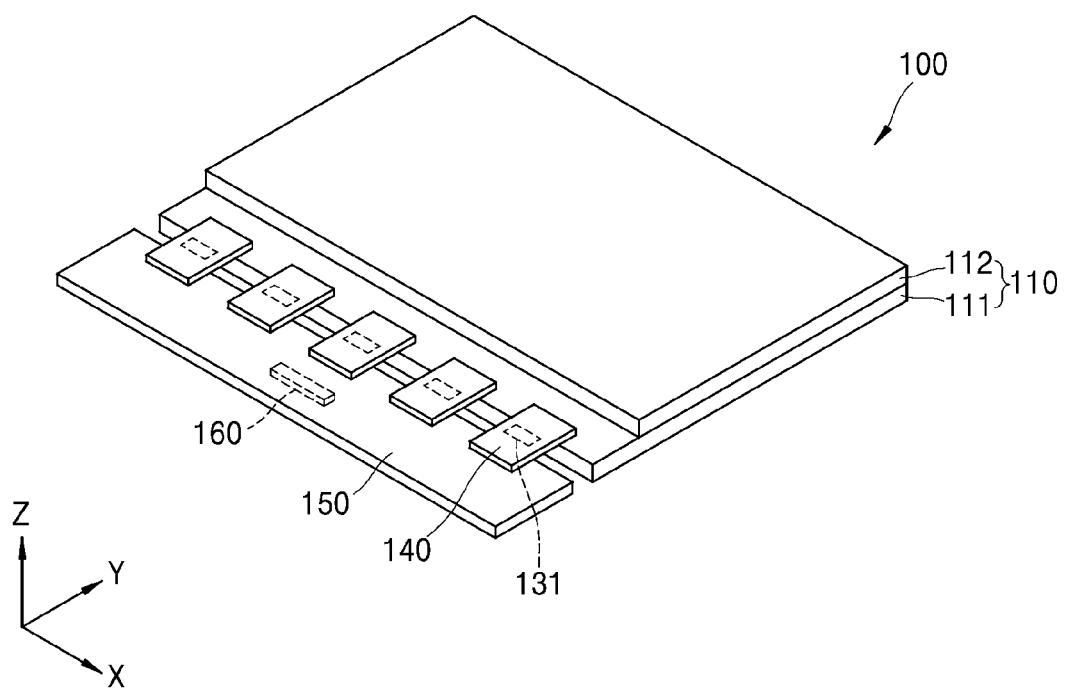
FIG. 9 is a perspective view illustrating a touch display device according to an aspect of an embodiment.
Figure 10:
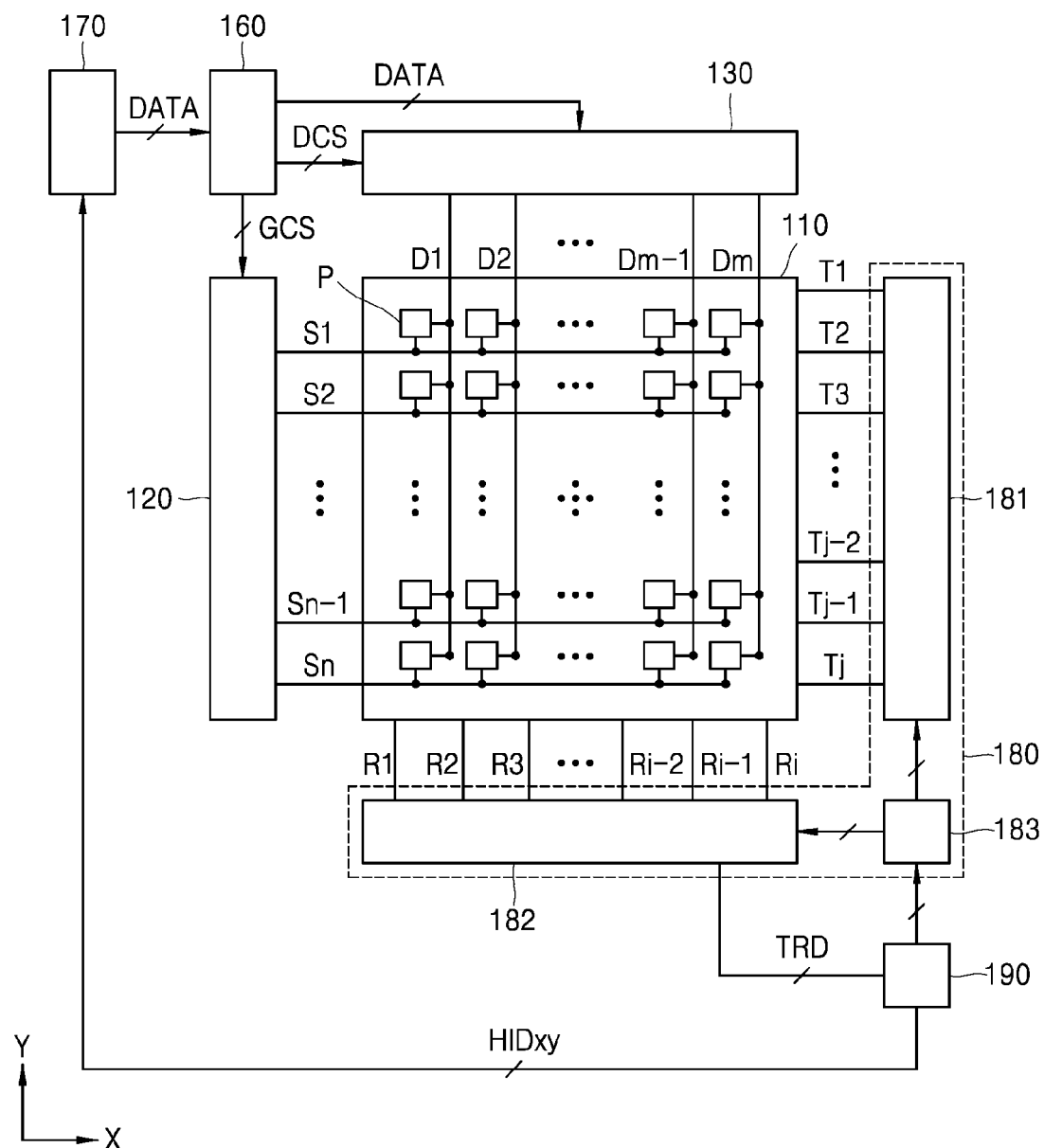
FIG. 10 is a block diagram illustrating a touch display device according to an aspect of an embodiment.

Referring to FIGS. 9 and 10, a touch display device 100 according to an aspect of an embodiment can comprise a display panel 110, a scan diver 120, a data driver 130, a timing controller 150, a host system 170 and a touch driver 180 and a touch coordinate generator 190.

In the disclosure, a touch display device implemented as an organic light emitting display (OLED) device is provided as an example but is not limited to this example. The touch display device can be implemented as various types of flat panel display devices such as a liquid crystal display (LCD) device and the like.

The display panel 110 can comprise a display area that is an area provided with a plurality of pixels (P) and displaying an image. Data lines (D1 to Dm; m denotes 2 or greater positive integers) and scan lines (S1 to Sn; n denotes 2 or greater positive integers) can be formed on the display panel 110. The data lines (D1 to Dm) can be configured to cross the scan lines (S1 to Sn). The scan lines can be gate lines. The pixels (P) can be formed in an area defined by a structure where the scan lines and the data lines cross.

The pixels (P) of the display panel 110 can respectively connect to any one of the data lines (D1 to Dm) and any one of the scan lines (S1 to Sn).

Each of the pixels (P) of the display panel 110 can comprise a driving transistor configured to adjust electric current between drain-sources on the basis of a data voltage supplied to a gate electrode, a scan transistor configured to be turned on according to a scan signal of the scan line and to supply a data voltage of the data line to a gate electrode of a driving transistor, an organic light emitting diode configured to emit light on the basis of electric current between drain-sources of the driving transistor, and a capacitor for storing a voltage of a gate electrode of the driving transistor. Accordingly, each of the pixels (P) can emit light on the basis of electric current supplied to the organic light emitting diode.

The scan driver 120 can receive a scan control signal (GCS) from the timing controller 160. The scan driver 120 can supply scan signals to the san lines (S1 to Sn) according to the scan control signal (GCS).

The scan driver 120 can be formed in a non-display area at one side or both sides of a display area of the display panel 110 according to the gate driver in panel (GIP) method. Alternatively, the scan driver 120 can be manufactured as a driving chip, can be mounted onto a flexible film and can be attached to one side or both sides of the display area of the display panel 110 according to the tape automated bonding (TAB) method.

The data driver 130 can receive digital video data (DATA) and a data control signal (DCS) from the timing controller 160. The data driver 130 can convert the digital video data (DATA) into an analogue positive polarity/negative polarity data voltage according to the data control signal (DCS) and can supply the converted digital video data (DATA) to the data lines. For example, pixels to which data voltages are supplied can be selected according to the scan signals of the scan driver 120, and the data voltages can be supplied to the selected pixels.

The data driver 130, as in FIG. 9 can comprise a plurality of source drive ICs 131. Each of the plurality of source drive ICs 131 can be mounted onto a flexible film 140 according to the chip on film (COF) method or the chip on plastic (COP) method. The flexible film 140 can be attached onto pads in the non-display area of the display panel 110 using an anisotropic conducting film. Accordingly, the plurality of source drive ICs 131 can connect to the pads.

A circuit board 150 can be attached to the flexible films 140. A plurality of circuits implemented as driving chips can be mounted onto the circuit board 150. For example, the timing controller 160 can be mounted onto the circuit board 150. The circuit board 150 can be a printed circuit board or a flexible printed circuit board.

The timing controller 160 can receive digital video data (DATA) and timing signals from the host system 170. The timing signals can comprise a vertical synchronization signal, a horizontal synchronization signal, a data enable signal, a dot clock and the like. The vertical synchronization signal is a signal that defines 1 frame period. The horizontal synchronization signal is a signal that defines 1 horizontal period required for supplying data voltages to pixels of 1 horizontal line of the display panel (DIS). The data enable signal is a signal that defines a period during which effective data are input. The dot clock is a signal that is repeated on the basis of a predetermined short cycle.

The timing controller 160 can generate a data control signal (DCS) for controlling an operation timing of the data driver 130 and a scan control signal (GCS) for controlling an operation timing of the scan driver 120 according to timing signals to control an operation timing of the scan driver 120 and the data driver 130. The timing controller 160 can output a scan control signal (GCS) to the scan driver 120 and can output digital video data (DATA) and a data control signal (DCS) to the data driver 130.

The host system 170 can be implemented as a navigation system, a set top box, a DVD player, a blue ray player, a personal computer (PC), a home theater system, a broadcast receiver, a phone system and the like. The host system 170 can comprise a system on chip (SoC) into which a scaler is built, and can convert digital video data (DATA) of an input image into a format appropriate to be displayed on the display panel 110. The host system 170 can transmit the digital video data (DATA) and timing signals to the timing controller 160.

In addition to the data lines (D1 to Dm) and the scan lines (S1 to Sn), first and second touch electrodes can be formed at the display panel 110. The first touch electrodes can be configured to cross the second touch electrodes. The first touch electrodes can connect to a first touch driver 181 through first touch lines (T1 to Tj;j denotes 2 or greater positive integers). The second touch electrodes can connect to a second touch driver 182 through second touch lines (R1 to Ri; i denotes 2 or greater positive integers). A touch sensor can be formed in each of the portions where the first touch electrodes and the second touch electrodes are crossed. In the embodiments of the present disclosure, the touch sensor is implemented as a mutual capacitance but not be limited.

The touch driver 180 can supply a driving pulse to the first touch electrodes through the first touch lines (T1 to Tj) and can sense a change in amounts of charge of each of the touch sensors through the second touch lines (R1 to Ri). Referring to FIG. 10, the first touch lines (T1 to Tj), which are Tx lines for supplying a driving pulse, and the second touch lines (R1 to Ri), which are Rx lines for sensing a change in amounts of charge of each of the touch sensors, are provided as examples.

The touch driver 180 can comprise a first touch driver 181, a second touch driver 182 and a touch controller 183. The first touch driver 181, the second touch driver 182, and the touch controller 183 can be integrated in a single readout integrated circuit (ROIC).

The first touch driver 181 can select a first touch line to which a driving pulse is output under the control of the touch controller 183, and can supply a driving pulse to the selected first touch line. For example, the first touch driver 181 can supply driving pulses consecutively to the first touch lines (T1 to Tj).

The second touch driver 182 can select second touch lines that receive changes in amounts of charge of the touch sensors under the control of the touch controller 183, and can receive the changes in amounts of charge of the touch sensors through the selected second touch lines. The second touch driver 182 can sample the changes in amounts of charge of the touch sensors, received through the second touch lines (R1 to Ri), and can convert the same into touch raw data (TRD) that are digital data.

The touch controller 183 can generate a Tx setup signal for setting a first touch line to which a driving pulse is output in the first touch driver 181, and a Rx setup signal for setting a second touch line that receives a touch sensor voltage in the second touch driver 182. The touch controller 183 can also generate timing control signals for controlling operation timings of the first touch driver 181 and the second touch driver 182.

The touch coordinate generator 190 can receive the touch row data (TRD) from the touch driver 180. The touch coordinate generator 190 can generate touch coordinate(s) according to a method of generating a touch coordinate, and can output touch coordinate data (HIDxy) including information on the touch coordinate(s) to the host system 170.

The touch coordinate generator 190 can be implemented as a micro controller unit (MCU). The host system 170 can analyze the touch coordinate data (HIDxy) input from the touch coordinate generator 190 and can execute an application program associated with a coordinate of a user's touch. The host system 170 can transmit digital video data (DATA) and timing signals to the timing controller 160 on the basis of the executed application program.

The touch driver 180 can be included in source drive ICs 131 or can be manufacture as an additional driving chip and mounted onto the circuit board 150. The touch coordinate generator 190 can be manufactured as a diving chip and mounted onto the circuit board 150.

The display panel 110 can comprise a first substrate 111 and a second substrate 112, and a thin film transistor layer, a light emitting element layer, an encapsulation layer and a touch sensing layer that are disposed between the first and second substrates 111, 112.

The first substrate 111 can be a substrate made of a plastic film or glass.

The thin film transistor layer can be formed on the first substrate 111. The thin film transistor layer can comprise scan lines, data lines and thin film transistors. Each of the thin film transistors can comprise a gate electrode, a semiconductor layer, a source electrode and drain electrodes. In case the scan driver is formed according to the gate driver in panel (GIP) method, the scan driver can be formed along with the thin film transistor.

The light emitting element layer can be formed on the thin film transistor. In the present disclosure, an organic light emitting element layer, which uses an organic light emitting element as a light emitting element, is provided as an example of the light emitting element layer but is not limited to this example. The organic light emitting element layer can comprise a first electrode, an organic light emitting layer, a second electrode and banks.

Each of the organic light emitting layers can comprise a hole transporting layer, a light emitting layer (an organic light emitting layer) and an electron transporting layer. In this case, when a voltage is supplied to the first electrode and the second electrode, a hole and an electron can move to the light emitting layer respectively through the hole transporting layer and the electron transporting layer, can be coupled to each other in the light emitting layer and can emit light. Pixels can be provided in an area where the organic light emitting element layer is formed. Accordingly, the area where the organic light emitting element layer is formed can be defined as a display area. An area around the display area can be defined as a non-display area.

The encapsulation layer can be formed on the organic lighting emitting element layer. The encapsulation layer can prevent air or moisture from infiltrating into the organic light emitting element layer. The encapsulation layer can comprise at least one organic encapsulation film.

A touch sensing layer can be formed on the encapsulation layer. The touch sensing layer can comprise first touch electrodes and second touch electrodes for sensing a user's touch, and can also comprise bridge electrodes for electrically connecting the first touch electrodes or electrically connecting the second touch electrodes.

Below, a touch display device according to an aspect of an embodiment is described with reference to FIGS. 11 to 14.

A first substrate 111 can be referred to as a base substrate and can comprise a display area (DA) and a non-display area (NDA).

The first substrate 111, as described above, can be made of a glass-based material but not be limited. In case the first substrate 111 is applied to a flexible touch display device, a plastic substrate such as a polyimide-based substrate having flexibility can be used as the first substrate 111.

A pad area (PA) where pads are formed and a dam (DAM) can be included in the non-display area (NDA).

In this case, a plurality of dams (DAM) can be formed, and a dam can be formed respectively in different layers.

Figure 11:
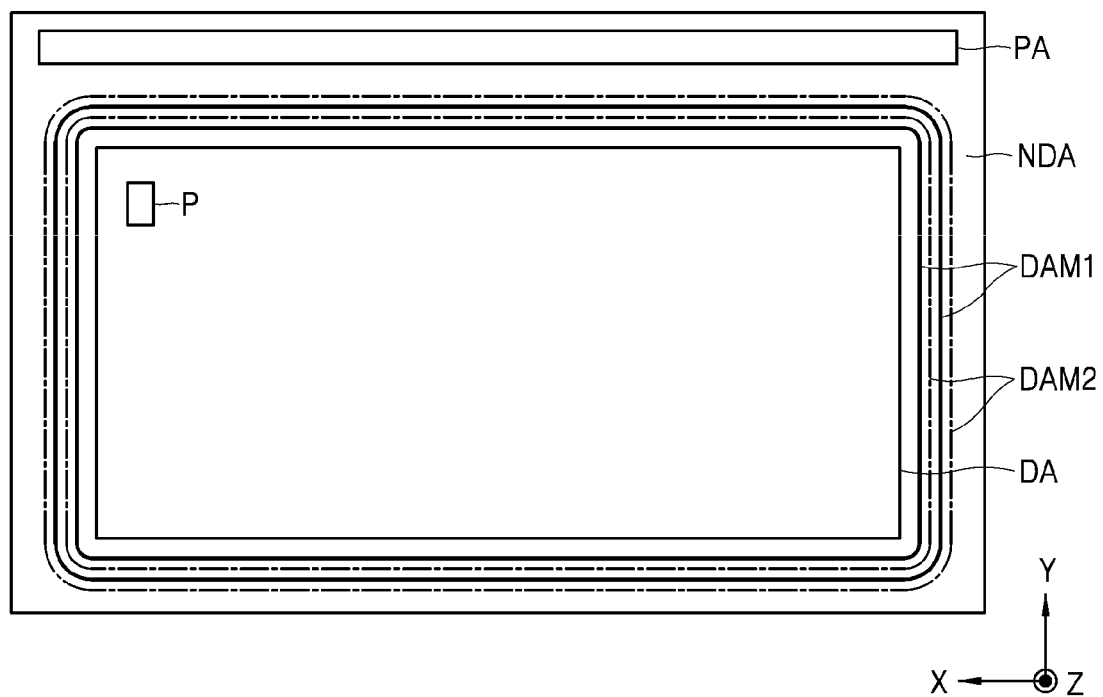
FIG. 11 is a plan view schematically illustrating a first substrate according to an aspect of an embodiment.

FIG. 11 illustrates an embodiment where two couples of dams (DAM) respectively disposed in different layers. In FIG. 11, a plurality of first dams (DAM1) and a plurality of second dams (DAM2) are disposed to overlap mutually in an up-down direction but are not limited to this example. The plurality of second dams (DAM2) can be disposed between the display area (DA) and the plurality of first dams (DAM1), or the plurality of first dams (DAM1) can be disposed between the display area (DA) and the plurality of second dams (DAM2).

A thin film transistor layer and an organic light emitting element layer can be formed in the display area (DA) of the first substrate 111.

The thin film transistor layer can comprise thin film transistors 210, a gate insulation layer 220, an interlayer insulation layer 230, a protecting layer 240 and a planarizing layer 250.

A buffer layer can be formed on one surface of the first substrate 111. The buffer layer can be formed on one surface of the first substrate 111 to protect the thin film transistors 210 and the organic light emitting elements 260 from moisture infiltrating through the first substrate 111 vulnerable to infiltration of moisture. One surface of the first substrate 111 can be a surface that faces the second substrate 112.

The buffer layer can be formed into a plurality of inorganic layers that are alternately stacked. For example, the buffer layer can be formed into a multiple layer in which one or more inorganic films of a silicon oxide film (SiOx), a silicon nitride film (SiNx) and SiON are alternately stacked.

The thin film transistor 210 can be formed on the buffer layer. The thin film transistor 210 can comprise an active layer 211, a gate electrode 212, a source electrode 213 and a drain electrode 214. In the present disclosure, the thin film transistor 210 formed according to the top gate method by which the gate electrode 212 is disposed at an upper portion of the active layer 211 is described as an example but is not limited to this example. The thin film transistor 210 can be formed according to the bottom gate method or the double gate method.

The active layer 211 can be formed on the buffer layer. The active layer 211 can be made of an oxide semiconductor material such as an indium gallium zinc oxide (IGZO) but not be limited. The active layer 211 can also be made of low temperature polycrystalline silicon (LTPS) or amorphous silicon (a-Si).

A light blocking layer can be formed between the buffer layer and the active layer 211 to block external light incident to the active layer 211.

The gate insulation layer 220, which can insulate the active layer 211 from the gate electrode 212, can be formed on the active layer 211. The gate insulation layer 220 can be formed into an inorganic layer e.g., a silicon oxide film (SiOx), a silicon nitride film (SiNx) or a multiple layer thereof.

The gate electrode 212 and the gate line can be formed on the gate insulation layer 220. The gate electrode 212 and the gate line can be formed into a single layer or a multi layer comprising any one of molybdenum (Mo), aluminum (Al), chromium (Cr), gold (Au), titanium (Ti), nickel (Ni), neodymium (Nd) and copper (Cu) or an alloy thereof.

The interlayer insulation layer 230 can be formed on the gate electrode 212 and the gate line. The interlayer insulation layer 230 can be formed into an inorganic film, e.g., a silicon oxide film (SiOx), a silicon nitride film (SiNx) or a multiple layer thereof.

A source electrode 213, a drain electrode 214 and a data line can be formed on the interlayer insulation layer 230. The source electrode 213 and the drain electrode 214 can respectively connect to the active layer 211 through a contact hole that passes through the gate insulation layer 220 and the interlayer insulation layer 230. The source electrode 213, the drain electrode 214 and the data line can be formed into a single layer or a multi layer comprising any one of molybdenum (Mo), aluminum (Al), chromium (Cr), gold (Au), titanium (Ti), nickel (Ni), neodymium (Nd) and copper (Cu) or an alloy thereof.

The protecting layer 240 for insulating the thin film transistor 210 can be formed on the source electrode 213, the drain electrode 214 and the data line. The protecting layer 240 can be formed into an inorganic film. e.g., a silicon oxide film (SiOx), a silicon nitride film (SiNx) or a multiple layer thereof.

The planarizing layer 250 for planarizing a step created by the thin film transistor 210 can be formed on the protecting layer 240. The planarizing layer 250 can be formed into an organic film of an acryl resin, an epoxy resin, a phenolic resin, a polyamide resin, a polyimide resin and the like.

An organic light emitting element layer can be formed over the thin film transistor layer. The organic light emitting element layer can comprise organic light emitting elements 260 and bank layers 270.

For example, a plurality of light emitting elements can be disposed in the display area. In the present disclosure, an organic light emitting element is described as an example of the light emitting element but is not limited to this example.

The organic light emitting element 260 and the bank layer 270 can be formed on the planarizing layer 250. The organic light emitting element can comprise a first electrode 261, an organic light emitting layer 262 and a second electrode 263.

The first electrode 261 can be an anode electrode and the second electrode 263 can be a cathode electrode.

The first electrode 261 can be formed on the planarizing layer 250. The first electrode 261 can connect to a source electrode 223 of the thin film transistor 210 through a contact hole that passes through the protecting layer 240 and the planarizing layer 250. The first electrode 261 can be made of a metallic material having high reflectivity such as a structure (Ti/Al/Ti) where aluminum and titanium are stacked, a structure (ITO/Al/ITO) where aluminum and ITO are stacked, an APC alloy, and a structure (ITO/APC/ITO) where an APC alloy and ITO are stacked. The APC alloy is an alloy of silver (Ag), palladium (Pd) and copper (Cu).

The bank layer 270 can be configured to cover an edge of the first electrode 261 on the planarizing layer 250 to separate pixels (P). For example, the bank layer 270 can serve as a pixel defining layer that defines pixels (P). Specifically, the bank layer 270 is disposed to have a plurality of openings (OA) and the opening (OA) can correspond to light emitting areas (EA) of the organic light emitting elements 260.

The bank layer 270 can be formed into an organic film of an acryl resin, an epoxy resin, a phenolic resin, a polyamide resin, a polyimide resin and the like.

The organic light emitting layer 262 can be formed on the first electrode 261 and the bank layer 270. The organic light emitting layer 262 can comprise a hole transporting layer, at least one light emitting layer and an electron transporting layer. In this case, when a voltage is supplied to the first electrode 261 and the second electrode 263, a hole and an electron can move to the light emitting layer respectively through the hole transporting layer and the electron transporting layer, and can be mutually coupled in the light emitting layer and can emit light.

The organic light emitting layer 262 can be formed into a white light emitting layer that emits white light. In this case, the organic light emitting layer 262 can be configured to partially overlap the first electrode 261 and the bank layer 270. In this case, a color filter can be further formed over the organic light emitting layer 262.

The organic light emitting layer 262 can comprise a red light emitting layer that emits red light, a green light emitting layer that emits green light, or a blue light emitting layer that emits blue light. In this case, the organic light emitting layer 262 can be formed in an area corresponding to the first electrode 261, and may not be further provided with an additional color filter.

The second electrode 263 can be formed on the organic light emitting layer 262. In case an organic light emitting display device is formed into a top emission structure, the second electrode 263 can be made of a transparent conductive material (TCO) such as ITO and IZO that can transmit light or can be made of a semi-transmissive conductive material such as magnesium (Mg), silver (Ag) or an alloy of magnesium (Mg) and silver (Ag).

An encapsulation layer 280 configured to cover a plurality of light emitting elements can be formed over the organic light emitting element layer from the display area (DA) to the non-display area (NDA) of the first substrate 111.

The encapsulation layer 280 can prevent air or moisture from infiltrating into the organic light emitting layer 262 and the second electrode 263. To this end, the encapsulation layer 280 can comprise at least one inorganic film and at least one organic film. For example, the encapsulation layer 280 can comprise a first inorganic encapsulation film 281, an organic encapsulation film 282 and a second inorganic encapsulation film 283.

The first inorganic encapsulation film 281 can be disposed on the second electrode 263. The first inorganic encapsulation film 281 can be configured to cover the second electrode 263. The organic encapsulation film 282 can be disposed on the first inorganic encapsulation film 281. The organic encapsulation film 282 can be thick enough to prevent particles from passing through the first inorganic encapsulation film 281 and infiltrating into the organic light emitting layer 262 and the second electrode 263. The second inorganic encapsulation film 283 can be disposed on the organic encapsulation film 282. The second inorganic encapsulation film 283 can be configured to cover the organic encapsulation film 282.

The first and second inorganic films 281, 283 can be respectively made of a silicon nitride, an aluminum nitride, a zirconium nitride, a titanium nitride, a hafnium nitride, a tantalum nitride, a silicon oxide, an aluminum oxide, or a titanium oxide.

The organic encapsulation film 282 can comprise an acryl resin or an epoxy resin and can have a predetermined thickness to ensure a lens focal length between the light emitting element and a below-described lens layer.

The encapsulation layer 280 can comprise a closed curve-shaped first dam (DAM1) that is disposed in the non-display area (NDA) to surround the organic encapsulation film 282. Accordingly, a flow of the organic encapsulation film 282 that is highly flowable can be prevented. For example, the first dam (DAM1) can be configured to surround an outer edge of the display area (DA) and to block a flow of the organic encapsulation film 282 that constitutes the encapsulation layer 280.

Accordingly, the first dam (DAM1) can be disposed between the display area (DA) and the pad area (PA) and can block a flow of the organic encapsulation film 282 such that the organic encapsulation film 282, constituting the encapsulation layer 280, is prevented from invading into the pad area (PA). Accordingly, the first dam(DAM1) can block the organic encapsulation film 282 from being exposed outside the display device or invading into the pad area (PA).

Figure 13:
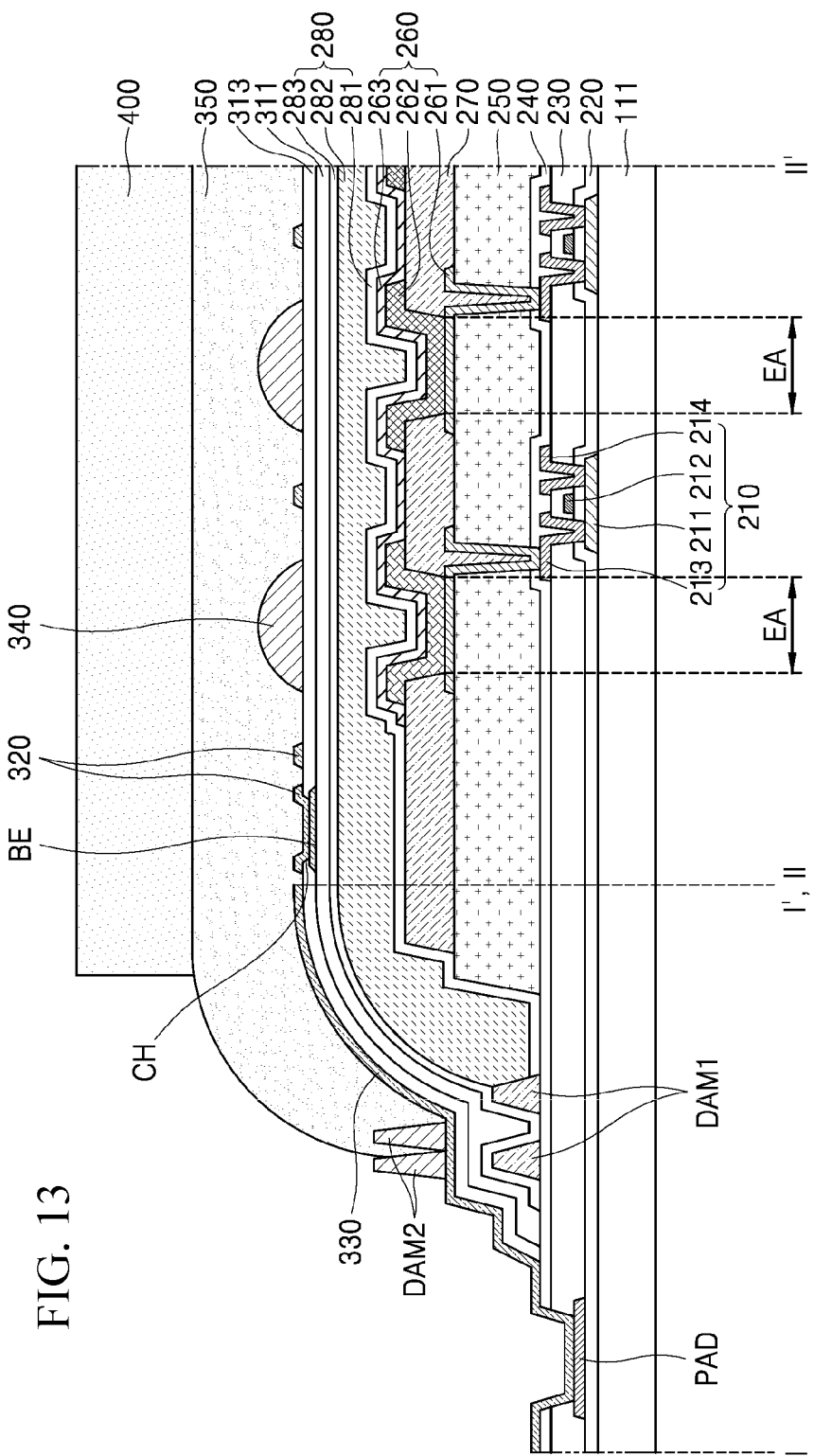
FIG. 13 is a cross-sectional view illustrating an example of section I-I' and section II-II' in FIG. 12.

The first dam (DAM1) can be formed into a single dam. In case a plurality of first dams (DAM1) is formed, a flow of the organic encapsulation film 282 can be blocked more effectively. In FIG. 13 of the present disclosure, two first dams (DAM1) are illustrated but are not limited to this example.

The first dam (DAM1) can be formed at the same time as the planarizing layer 250 or the bank layer 270 of the pixel (P) are formed, and can be made of the same material as the planarizing layer 250 or the bank layer 270.

A touch sensing layer can be formed on the encapsulation layer 280. The touch sensing layer can comprise touch electrodes 320 including first touch electrodes (TE) and second touch electrodes (RE), bridge electrodes (BE), a lens layer 340, a touch buffer layer 311 and an insulation layer 313.

The touch buffer layer 311 can be formed on the encapsulation layer 280, and a pad (PAD) can be configured to be exposed in the display area (DA) and the non-display area (NDA). The touch buffer layer 311 can be configured to overlay the first dam (DAM1) under the encapsulation layer 280.

The touch buffer layer 311 can prevent a liquid chemical such as a develop or an etchant, which is used to manufacture touch electrodes formed on the touch buffer layer 311, or a particle such as external moisture and the like from infiltrating into the light emitting element including an organic material.

The bridge electrodes (BE) can be formed on the touch buffer layer 311. The bridge electrodes (BE) can be formed in the display area (DA), and can electrically connect the first touch electrodes (TE) formed on the insulation layer 313.

Figure 12:
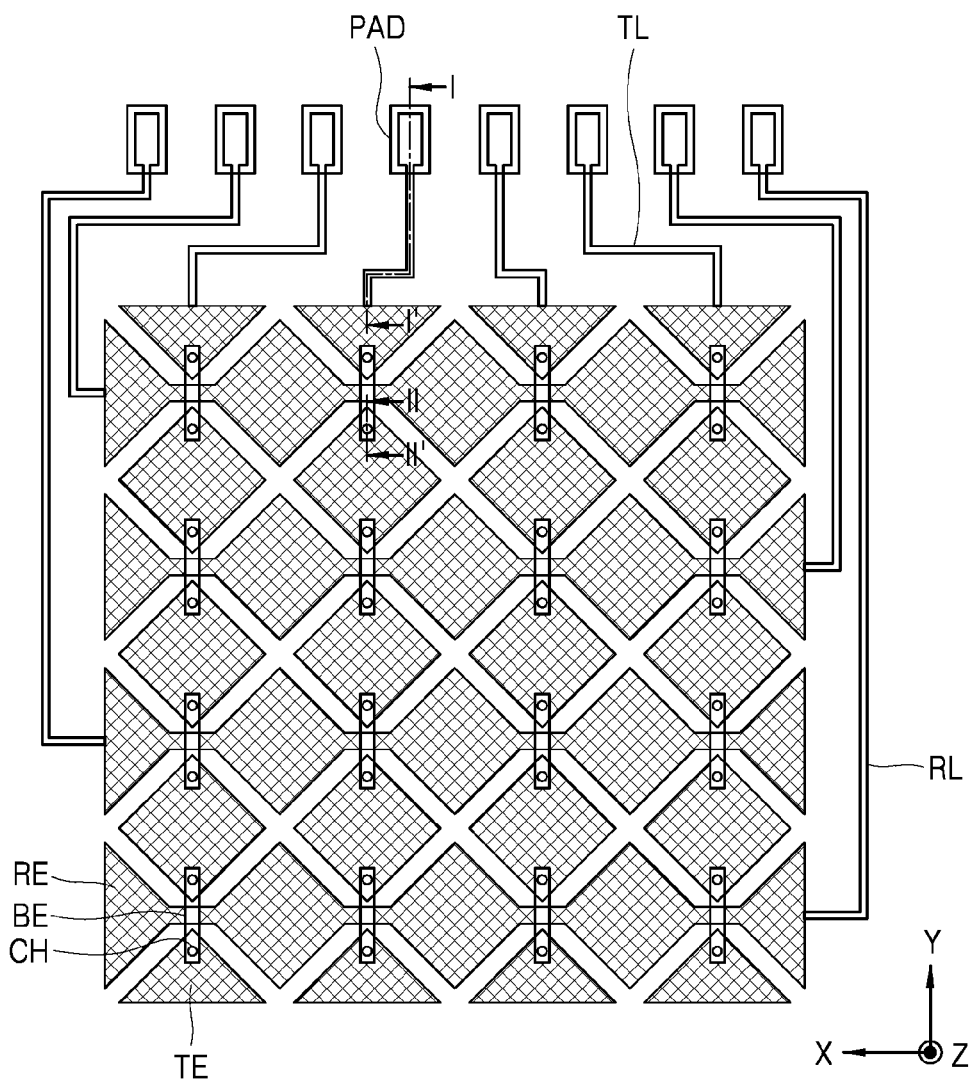
FIG. 12 is a plan view illustrating an example of a touch sensing layer disposed on a first substrate according to an aspect of an embodiment.

To prevent a mutual short circuit of the first touch electrodes (TE) and the second touch electrodes (RE) in an area where the first touch electrodes (TE) and the second touch electrodes (RE) are crossed, first touch electrodes (TE) adjacent to each other in a first direction (the y-axis direction) can be electrically connected through the bridge electrodes (BE), as in FIG. 12. The bridge electrode (BE) can be disposed in a layer different from those of the first and second touch electrodes (TE and RE), and can be connected to the first touch electrodes (TE) adjacent to each other through contact holes (CH). The bridge electrode (BE) and the second touch electrode (RE) can be crossed.

In this case, the contact holes (CH) can be configured to pass through the insulation layer 313. The bridge electrode (BE) can be disposed at a lower portion of the insulation layer 313 and can be exposed by two contact holes. As such, the bridge electrode (BE) can connect with two first touch electrodes (TE) adjacent to the bridge electrode (BE).

The insulation layer 310 can be formed over the touch buffer layer 311 to cover the bridge electrodes (BE), and can insulate the bridge electrodes (BE) from the second touch electrodes (RE). The insulation layer 313 can be disposed between the bridge electrodes (BE) to insulate the bridges electrodes (BE) from each other.

The insulation layer 313 can be configured to extend to the non-display area (NDA) as well as the display area (DA). The insulation layer 313 can be configured to overlay an area of the first dam (DAM1) and can reduce a height of a step caused by the first dam (DAM1).

Accordingly, a plurality of mesh-type touch electrodes 320 can be formed on the insulation layer 313 over the encapsulation layer 280. The touch electrode 320 can comprise first touch electrodes (TE) and second touch electrodes (RE).

The first touch electrodes (TE) and the second touch electrodes (RE) can be formed in the display area (DA). The first touch electrodes (TE) can be disposed in a first direction (the y-axis direction) and can connect to each other, and the second touch electrodes (RE) can be disposed in a second direction (the x-axis direction) and can connect to each other. The first direction (the y-axis direction) can be a direction in parallel with a direction of scan lines (S1 to Sn), and the second direction (the x-axis direction) can be a direction in parallel with a direction of data lines (D1 to Dm). Alternatively, the first direction (the y-axis direction) can be a direction in parallel with a direction of data lines (D1 to Dm), and the second direction (the x-axis direction) can be a direction in parallel with a direction of scan lines (S1 to Sn).

Each of the first touch electrodes (TE) connected in the first direction (the y-axis direction) can be electrically insulated from its adjacent first touch electrodes (TE) in the second direction (the x-axis direction). Each of the second touch electrodes (RE) connected in the second direction (the x-axis direction) can be electrically insulated from its adjacent second touch electrodes (RE) in the first direction (the y-axis direction).

As such, in an area where the first touch electrode (TE) and the second touch electrode (RE) cross, a mutual capacitance corresponding to a touch sensor can be formed.

Figure 14:
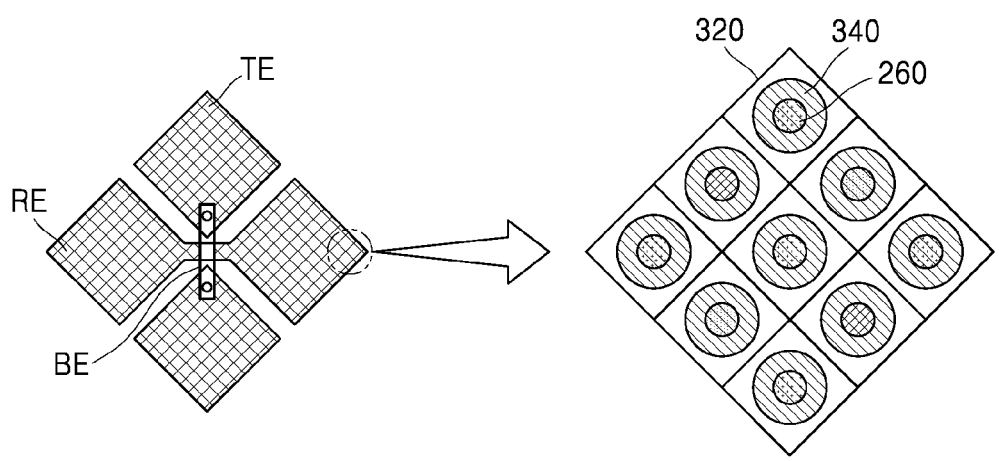
FIG. 14 is an enlarged plan view illustrating a touch electrode according to an aspect of an embodiment.

The touch electrode 320 can be patterned to have a mesh shape. The touch electrodes 320, as illustrated in FIG. 14, can be formed into a mesh shape to have a hollow opening.

As the touch electrode 320 is formed into a mesh shape, light emitting elements 260 below the touch electrode can correspond to the hollow opening of the touch electrode 320 and light output efficiency can be improved.

The touch electrode 320 can be disposed to correspond to the bank layer 270 therebelow. The bank layer 270, as described above, can be disposed to have a plurality of openings, and the openings can correspond to light emitting areas (EA) of the light emitting elements 260. Accordingly, the opening of the touch electrode 320 can also be disposed to correspond to the opening of the bank layer 270.

Accordingly, the touch electrode 320 can be disposed along the bank layer 270 to correspond to the bank layer 270. When the touch electrode 320 is disposed to correspond to the bank layer 270 as described above, the opening of the touch electrode 320 can also be disposed to correspond to the light emitting area (EA), thereby making it possible to minimize deterioration of light output efficiency, which is caused by an overlap of the touch electrode 320 and the light emitting area (EA).

A touch pad (PAD) can be disposed in the non-display area (NDA), and a touch routing wire 330, which is disposed to electrically connect the touch pad (PAD) and the touch electrode 320, can be formed on the insulation layer 313.

In this case, the touch pad (PAD) can be made of the same material as the gate electrode 212 and can be disposed in the same layer as the gate electrode 212, and the touch routing wire 330 can be made of the same material as the touch electrode 320 and can be disposed in the same layer as the touch electrode 320.

A plurality of convexly shaped lens layers 340 can be formed on the insulation layer 313. In this case, the lens layer 340 can be disposed inside the touch electrode 320.

The touch electrode 320, which has a mesh shape as illustrated in FIG. 14, can have an opening therein. In this case, each of the light emitting elements 260 can be disposed to correspond to the opening of the touch electrode 320.

The lens layer 340 can be disposed to correspond to the light emitting area (EA) of the light emitting element 260. Specifically, the light emitting area (EA) of the light emitting element 260 can be disposed to correspond to one or more lens layers 340. In FIG. 14, a single lens layer 340 corresponds to the light emitting area (EA) of a single light emitting element 260 but is not limited to this example. A plurality of lens layers 340 can correspond to the light emitting area (EA) of a single light emitting element 260.

According to the present disclosure, the lens layer 340 corresponding to the light emitting area (EA) of the light emitting element 260 can be disposed over the encapsulation layer 280 having a predetermined thickness such that the light emitting element 260 is spaced a predetermined distance apart from the lens layer 340. When the light emitting element 260 is spaced a predetermined distance apart from the lens layer 340, a focal length of a lens for improving efficiency of concentrating and outputting light emitted from the light emitting element 260 can be ensured, thereby improving luminance efficiency.

The lens layer 340 can be disposed not to overlap the touch electrode 320. Light rays at a predetermined angle or greater among light rays output from the light emitting element 260 can be totally reflected. The totally reflected light rays can be re-reflected inwards and can vanish instead of being output outwards.

As the light rays at an angle or greater, at which total reflection occurs, may not substantially contribute to light output, an area, where the light rays at an angle or greater at which total reflection occurs travels, can be a dead zone (Dead Zone). When the mesh-shaped touch electrode 320 corresponds to the dead zone, the touch electrode 320 may not interfered with emitting light rays with the help of the pattern.

The lens layer 340 can be disposed to overlay the light emitting area (EA) of the light emitting element 260. In case a size of the lens layer 340 is smaller than that of the light emitting area (EA), light rays passing through the lens layer 340 can be reduced, thereby causing lower light concentration efficiency and light output efficiency of the lens layer 340.

In case the size of the lens layer 340 is larger than that of the light emitting area (EA), a radius of curvature of the lens layer 340 becomes large, thereby causing lower power of a lens and lower light concentration efficiency.

Preferably, the lens layer 340 has a size large enough to maximize efficiency of concentrating light that is output from the light emitting area (EA) and that passes through the lens layer 340, while having a radius of curvature small enough to increase power. For example, the lens layer 340 may be disposed not to overlap the above-described dead zone and not to overlap the touch electrode 320, thereby maximizing power and light concentration efficiency.

The lens layer 340 can be made of a low-temperature photo acryl (PAC) material that can be formed in the low temperature process at 100 degrees Celsius or lower, but not be limited. For example, the lens layer 340 can comprise Polytriazine or a material where one or more of titanium dioxide ($TiO_2$), zirconium dioxide ($ZrO_2$) and a nano filler is added to Polytriazine.

According to the present disclosure, the lens layer 340 can be convexly formed through the exposure process.

The light emitting element 260 is disposed below the lens layer 340. In case a process of forming the lens layer 340 is carried out at high temperature, the light emitting element 260 below the lens layer 340 can be damaged due to high temperature. When the lens layer 340 according to the present disclosure comprises a material, which can be formed at a temperature of 100 degrees Celsius or lower, and is formed through a low temperature process, damage done to the light emitting element 260 in the process of forming the lens layer 340 can be minimized.

In the related art, in case a planarizing layer is formed on the touch electrode 320, a patterning process is carried out using an exposure process to form the planarizing layer.

Unlike a display device of the related art, the display device according to the present disclosure can be additionally provided with the lens layer 340. The exposure process used in a planarizing layer patterning process of the related art can be carried out to form a convex shape of the lens layer 340 without an additional mask process. Accordingly, an additional mask process is not required for forming the lens layer 340.

Thus, unlike the display device of the related art, the display device according to the present disclosure may not require an additional mask process in order for the lens layer 340 to be formed, thereby causing no deterioration of efficiency of processing and ensuring improved luminance efficiency.

The process of forming the lens layer 340 is described as follows. A lens film can be coated on the encapsulation layer 280 to cover the insulation layer 313. In this case, the lens film can comprise Polytriazine or a material where one or more of titanium dioxide (TiO$_2$), zirconium dioxide (ZrO$_2$) and a nano filler is added to Polytriazine such that the low temperature process is carried out as described above.

After the coating of the lens film, an edge bead removal (EBR) process for removing an edge is carried out, a pre-bake process for removing a solvent from the lens film is carried out, and an exposure process, in which a pattern of a mask is exposed to the lens film and the lens film exposed to light experiences a light reaction, is carried out.

Additionally, a develop process and a rinse process are carried out and then a post-exposure process and a cure process and the like are carried out to form the lens layer 340.

A lens protecting layer 350 can be disposed on the lens layer 340 to cover the lens layer 340. In the case, a refractive index of the lens protecting layer 350 can be configured to be lower than a refractive index of the lens layer 340. Accordingly, light concentration efficiency and light output efficiency can be further increased on an interface of the lens layer 340 by a difference between the refractive indices.

For example, the lens layer 340 can have a refractive index of 1.5 to 1.8, and the lens protecting layer 350 can have refractive index of 1.3 to 1.55. In this case, preferably, the refractive index of the lens protecting layer 350 can be configured to be lower than the refractive index of the lens layer 340 and a difference between the refractive indices can be configured to be as large as possible.

The lens protecting layer 350 can comprise a material in which a hydroxyl group (—OH group) or a fluorine group (—F group) is added to a substituent of an epoxy resin or an acryl resin, or a material in which a nano-sized hollow silica is added to an epoxy resin or an acryl resin. For example, a specific group is added to a substituent, or a substituent comprises an additional material such that the lens protecting layer 350 has a lower refractive index than an organic encapsulation film 282 of the encapsulation layer 280 including an epoxy resin or an acryl resin.

Thus, the refractive index of the organic encapsulation film 282 can be lower than the refractive index of the lens layer 340, and the refractive index of the lens protecting layer 350 can be lower than the refractive index of the organic encapsulation film 282.

The lens protecting layer 350 can be made of a material having high flowability like the organic encapsulation film 282. Accordingly, the lens protecting layer 350 can be formed according to an ink jet printing method. For example, the lens protecting layer 350 can be formed according to the ink jet printing method and then a UV curing process is carried out and a post bake process is carried out.

Accordingly, to prevent the highly flowable lens protecting layer 350 from flowing, a closed curve-shaped second dam (DAM2) configured to surround the lens protecting layer 350 can be formed. For example, the second dam (DAM2) can be configured to surround an outer edge of the display area (DA) and can block a flow of the lens protecting layer 350.

Thus, the second dam (DAM2) can be disposed between the display area (DA) and the pad area and can block the flow of the lens protecting layer 350 such that the lens protecting layer 350 does not invade the pad area. As a result, the second dam (DAM2) can prevent the lens protecting layer 350 from being exposed outside the display device or from invading the pad area.

The second dam (DAM2) can be formed into a single dam. However, the second dam (DAM2) can be formed into a plurality of second dams (DAM2) to block the flow of the lens protecting layer 350 more effectively. According to the present disclosure, in FIG. 13, two second dams (DAM2) are formed but are not limited to this example.

Specifically, the second dam (DAM2) can be formed in the non-display area (NDA) to surround the lens protecting layer 350, and can be formed on the touch routing wire 330. Accordingly, the touch routing wire 330 can be formed between the first dam (DAM1) and the second dam (DAM2). In this case, a plurality of the first dams (DAM1) and the second dams (DAM2) can be alternately disposed as in FIG. 11 but are not limited to this example. The first dam (DAM1) and the second dam (DAM2) can be disposed to overlap. Additionally, the second dam (DAM2) can be disposed between the first dam (DAM1) and the display area (DA), or the first dam (DAM1) can be disposed between the second dam (DAM2) and the display area (DA).

A polarizing layer 400 can be disposed on the lens protecting layer 350.

As described above, the display device according to an embodiment of the present disclosure can comprise a light emitting element layer, an intermediate layer on the light emitting element layer, a convexly shaped lens layer disposed on the intermediated layer and corresponding to the light emitting element layer, and a lens protecting layer on the intermediate layer to cover the lens layer. In this case, light output from a light emitting area of the light emitting element layer may not be totally reflected from the interface between the lens layer and the lens protecting layer.

Light output from an edge point of the light emitting area may not be totally reflected from the interface between the lens layer and the lens protecting layer.

The light emitting element layer can be disposed inside the lens layer, and a diameter (D) of the lens layer can be larger than a length (a) of the light emitting area.

A refractive index of the lens layer can be higher than a refractive index of the lens protecting layer and a refractive index of the intermediate layer.

The intermediate layer can comprise at least one organic layer and at least one inorganic layer.

Light output from the light emitting area can be primarily refracted on the interface between the intermediate layer and the lens layer, and the primarily refracted light can be secondarily refracted on the interface between the lens layer and the lens protecting layer. An incident angle of the primarily refracted light on the interface between the lens layer and the lens protecting layer is $\theta_i$, and in the case of $$\theta_i < \sin^{-1}\left(\frac{n_2}{n_1}\right),$$

total reflection may not occur. In this case, $n_1$ is a refractive index of the lens layer, and $n_2$ is a refractive index of the lens protecting layer.

With respect to a coordinate $p_o(0, 0)$ of an origin point of the lens layer, a coordinate of an edge point of the light emitting area is $p_p(x_p, y_p)$, and a coordinate of a point, where light output from the coordinate $p_p(x_p, y_p)$ is primarily refracted on the interface between the intermediate layer and the lens layer, is $p_g(x_g, y_g)$, and a coordinate of a point, where the primarily refracted light is secondarily refracted on the interface between the lens layer and the lens protecting layer, is $p_l(x_l, y_l)$.

In this case, an equation $$x_p = \frac{a}{2}$$

is satisfied, an equation $y_p=y_l-b$ is satisfied, and an equation $$x_g = \frac{y_g - (y_p - x_p \tan(90 - \theta_p))}{\tan(90 - \theta_p)}$$

is satisfied, an equation $y_g=y_p+b$ is satisfied, and an equation $x_l=\sqrt{2RS-S^2}$ is satisfied, and an equation $y_l=R-S$ is satisfied. In the above equation, $\theta_p$ denotes an incident angle of light output from $p_p(x_p, y_p)$ on the interface between the intermediate layer and the lens layer, a denotes a length of the light emitting area, R denotes a radius of curvature of the lens layer, S denotes a height of the lens layer, and b denotes a height of the intermediate layer.

A coordinate of a point where a virtual extension line of the primarily refracted light meets a lower interface of the intermediate layer can be expressed as $p'_g(x'_p, y'_p)$, an equation $\theta_i=\theta_n-\theta'_p$, is satisfied, an equation $\theta_n=\tan^{-1}(x_l/y_l)$ is satisfied, an equation $\theta'_p=\tan^{-1}((x_l-x'_p)/(y_l-y'_p))$ is satisfied, and an equation $$x'_p = \sqrt{\left(\frac{n_g}{n_1}\right)^2 \left((x_p - x_g)^2 + b^2\right) - b^2} + x_g$$

is satisfied, and an equation $y'_p=y_p$ is satisfied.

A refractive angle of the secondarily refracted light on the interface between the lens layer and the lens protecting layer can be expressed as $$\theta_t = \sin^{-1}\left(\frac{n_1}{n_2}\sin\theta_i\right).$$

The touch display device according to an embodiment of the present disclosure can comprise a base substrate including a display area and a non-display area, a plurality of light emitting element layers disposed in the display area, an intermediate layer disposed to cover the plurality of light emitting element layers, a plurality of mesh-shaped touch electrodes disposed on the intermediate layer, a plurality of lens layer having a convex shape, disposed inside the touch electrodes while being disposed on the intermediate layer, and a lens protecting layer disposed on the intermediate layer to cover the lens layer. Light output from a light emitting area of the light emitting element layer is not totally reflected from the interface between the lens layer and the lens protecting layer.

Light output from an edge point of the light emitting area may not be totally reflected from the interface between the lens layer and the lens protecting layer, the light emitting element layer can be disposed inside the lens layer, and a diameter (D) of the lens layer is larger than a length (a) of the light emitting area.

A refractive index of the lens layer can be higher than a refractive index of the lens protecting layer and a refractive index of the intermediate layer.

The intermediate layer can comprise at least one organic layer and at least one inorganic layer.

Light output from the light emitting area can be primarily refracted on the interface between the intermediate layer and the lens layer, and the primarily refracted light can be secondarily refracted on the interface between the lens layer and the lens protecting layer. An incident angle of the primarily refracted light on the interface between the lens layer and the lens protecting layer is $\theta_i$, and in the case of $$\theta_i < \sin^{-1}\left(\frac{n_2}{n_1}\right),$$

total reflection may not occur. In this case, $n_1$ is a refractive index of the lens layer, and $n_2$ is a refractive index of the lens protecting layer.

The touch display device can further comprise a bank layer having a plurality of openings and disposed below the intermediate layer, and the touch electrode can be disposed to correspond to the bank layer.

The lens layer can comprise or polytriazine or a material where one or more of titanium dioxide ($TiO_2$), Zirconium dioxide ($ZrO_2$) and a nano filler is added to polytriazine, and the lens protecting layer can comprise a material in which a hydroxyl group (—OH group) or a fluorine group (—F group) is added to a substituent of an epoxy resin or an acryl resin, or a material in which a nano-sized hollow silica is added to an epoxy resin or an acryl resin.

The intermediate layer can comprise an encapsulation layer, and the encapsulation layer can comprise at least one organic encapsulation film and a first dam disposed in the non-display area and configured to surround the organic encapsulation film.

The organic encapsulation film can comprise an epoxy resin or an acryl resin.

The touch display device can further comprise a second dam disposed in the non-display area and configured to surround the lens protecting layer.

A touch pad can be disposed in the non-display area, and a touch routing wire can be disposed over the encapsulation layer along the encapsulation layer to electrically connect the touch pad and the touch electrode. The touch routing wire can be disposed between the first dam and the second dam.

The present disclosure has been provided with reference to the embodiments illustrated in the drawings. However, the disclosure is not limited to the embodiments and the drawings set forth herein. Further, various modifications can be made by one having ordinary skill in the art within the scope of the technical spirit of the disclosure. Further, though not explicitly described during description of the embodiments of the disclosure, effects and predictable effects based on the configuration in the disclosure should be included in the scope of the disclosure.

What is claimed is:

1. A display device, comprising:
   a base substrate comprising a display area and a non-display area;
   a light emitting element layer disposed in the display area;
   a lens layer having a convex shape and disposed to correspond to the light emitting element layer;
   an intermediate layer including an encapsulation layer disposed between the light emitting element layer and the lens layer, the encapsulation layer including a first inorganic encapsulation film, a second inorganic encapsulation film and an organic encapsulation film disposed between the first inorganic encapsulation film and the second inorganic encapsulation film, and the intermediate layer further including an insulation layer disposed between the lens layer and the encapsulation layer;
a plurality of touch electrodes disposed on the insulation layer;
a lens protecting layer disposed on the intermediate layer and configured to cover the lens layer;
a first dam disposed in the non-display area and configured to surround the organic encapsulation film; and
a second dam disposed in the non-display area and configured to surround the lens protecting layer,
wherein a refractive index of the lens layer is higher than a refractive index of the organic encapsulation film in the encapsulation layer, and the refractive index of the organic encapsulation film is higher than a refractive index of the lens protecting layer,
wherein the refractive index of the lens layer is 1.8 and the refractive index of the lens protecting layer is 1.3,
wherein a bottom surface of the lens layer directly contacts an upper surface of the insulation layer, and a bottom surface of each of the plurality of touch electrodes directly contacts the upper surface of the insulation layer,
wherein a transistor is disposed below the light emitting element layer, and
wherein the first dam and the second dam are disposed in different layers so as to overlap each other in an upward and downward direction.

2. The display device of claim 1, wherein a total reflection of light output from an edge point of a light emitting area does not occur on an interface between of the lens layer and the lens protecting layer.

3. The display device of claim 1,
wherein a diameter (D) of the lens layer is larger than a length (a) of a light emitting area.

4. The display device of claim 1, wherein light output from a light emitting area is primarily refracted on an interface between the intermediate layer and the lens layer, and the primarily refracted light is secondarily refracted on an interface between the lens layer and the lens protecting layer,
an incident angle of the primarily refracted light on the interface between the lens layer and the lens protecting layer is $\theta_i$, and
in the case of $$\theta_i < \sin^{-1}\left(\frac{n_2}{n_1}\right),$$

total reflection does not occur, where $n_1$ is a refractive index of the lens layer, $n_2$ is a refractive index of the lens protecting layer, and $n_1 > n_2$,
wherein $n_2/n_1$ is less than or equal to 1.

5. The display device of claim 4, wherein with respect to a coordinate $p_o(0, 0)$ of an origin point of the lens layer, a coordinate of an edge point of the light emitting area is $p_p(x_p, y_p)$,
a coordinate of a point, where light output from the coordinate $p_p(x_p, y_p)$ is primarily refracted on the interface between the intermediate layer and the lens layer, is $p_g(x_g, y_g)$, and
a coordinate of a point, where the primarily refracted light is secondarily refracted on the interface between the lens layer and the lens protecting layer, is $p_t(x_t, y_t)$, and wherein an equation $$x_p = \frac{a}{2}$$

is satisfied, an equation $y_p = y_t - b$ is satisfied, an equation $$x_g = \frac{y_g - (y_p - x_p \tan(90 - \theta_p))}{\tan(90 - \theta_p)}$$

is satisfied, an equation $y_g = y_p + b$ is satisfied, an equation $x_t = \sqrt{2RS - S^2}$ is satisfied, and an equation $y_t = R - S$ is satisfied,
where $\theta_p$ denotes an incident angle of light output from the coordinate $p_p(x_p, y_p)$ on the interface between the intermediate layer and the lens layer, a denotes a length of the light emitting area, R denotes a radius of curvature of the lens layer, S denotes a height of the lens layer, and b denotes a height of the intermediate layer.

6. The display device of claim 5, wherein a coordinate of a point, where a virtual extension line of the primarily refracted light meets a lower interface of the intermediate layer, is $p'_g(x'_p, y'_p)$,
an equation $\theta_i = \theta_n - \theta'_p$ is satisfied,
an equation $\theta_n = \tan^{-1}(x_t/y_t)$ is satisfied,
an equation $\theta'_p = \tan^{-1}((x_t - x'_p)/(y_t - y'_p))$ is satisfied,
an equation $$x'_p = \sqrt{\left(\frac{n_g}{n_1}\right)^2 \left((x_p - x_g)^2 + b^2\right) - b^2} + x_g$$

is satisfied, and
an equation $y'_p = y_p$ is satisfied.

7. The display device of claim 6, wherein a refractive angle of the secondarily refracted light on the interface between the lens layer and the lens protecting layer is expressed as an equation $$\theta_t = \sin^{-1}\left(\frac{n_1}{n_2} \sin\theta_i\right),$$

where $n_1/n_2 \sin \theta_i$ is smaller than or equal to 1.

8. A touch display device, comprising:
a base substrate comprising a display area and a non-display area;
a plurality of light emitting element layers disposed in the display area;
a plurality of lens layers disposed over the plurality of light emitting element layers;
an intermediate layer disposed to cover the plurality of light emitting element layers, the intermediate layer including an encapsulation layer disposed between the plurality of the light emitting element layers and the plurality of lens layers, the encapsulation layer including a first inorganic encapsulation film, a second inorganic encapsulation film and an organic encapsulation film disposed between the first inorganic encapsulation film and the second inorganic encapsulation film, and the intermediate layer further including an insulation layer disposed on the encapsulation layer;
a plurality of touch electrodes having a mesh shape and disposed on the insulation layer of the intermediate layer, the plurality of lens layers having a convex shape and disposed inside the plurality of touch electrodes while being disposed on the intermediate layer;

a lens protecting layer disposed on the intermediate layer and configured to cover one lens layer of the plurality of lens layers;

a first dam disposed in the non-display area and configured to surround the organic encapsulation film; and a second dam disposed in the non-display area and configured to surround the lens protecting layer, wherein a refractive index of the plurality of lens layers is higher than a refractive index of the organic encapsulation film in the encapsulation layer, and the refractive index of the organic encapsulation film is higher than a refractive index of the lens protecting layer, wherein the refractive index of the lens layer is 1.8 and the refractive index of the lens protecting layer is 1.3, wherein a transistor is disposed below the plurality of light emitting element layers, and wherein the first dam and the second dam are disposed in different layers so as to overlap each other in an upward and downward direction.

9. The touch display device of claim 8, wherein a total reflection of light output from an edge point of a light emitting area does not occur on the interface between the one lens layer and the lens protecting layer.

10. The touch display device of claim 8, wherein one of the plurality of light emitting element layers is disposed inside one of the plurality of lens layers, and a diameter (D) of the one lens layer is larger than a length (a) of a light emitting area.

11. The touch display device of claim 8, wherein light output from a light emitting area is primarily refracted on an interface between the intermediate layer and the one lens layer, and the primarily refracted light is secondarily refracted on an interface between the one lens layer and the lens protecting layer, an incident angle of the primarily refracted light on the interface between the one lens layer and the lens protecting layer is $\theta_i$, and in the case of $$\theta_i < \sin^{-1}\left(\frac{n_2}{n_1}\right),$$

total reflection does not occur, where $n_1$ is a refractive index of the lens layer, and $n_2$ is a refractive index of the lens protecting layer, wherein $n_2/n_1$ is less than or equal to 1.

12. The touch display device of claim 8, wherein the touch display device further comprises a bank layer having a plurality of openings and disposed below the intermediate layer, and the plurality of touch electrodes are disposed to correspond to the bank layer.

13. The touch display device of claim 8, wherein the one lens layer comprises polytriazine or a material where one or more of titanium dioxide ($TiO_2$), Zirconium dioxide ($ZrO_2$) and a nano filler is added to polytriazine.

14. The touch display device of claim 8, wherein the lens protecting layer comprises a material in which a hydroxyl group (—OH group) or a fluorine group (—F group) is added to a substituent of an epoxy resin or an acryl resin, or a material in which a nano-sized hollow silica is added to an epoxy resin or an acryl resin.

15. The touch display device of claim 8, wherein the organic encapsulation film comprises an epoxy resin or an acryl resin.

16. The touch display device of claim 8, wherein a touch pad is disposed in the non-display area, a touch routing wire is disposed over the encapsulation layer along the encapsulation layer to electrically connect the touch pad and at least one of the plurality of touch electrodes, and the touch routing wire is disposed between the first dam and the second dam.

17. A touch display device, comprising:

a base substrate comprising a display area and a non-display area;

a plurality of light emitting element layers disposed in the display area;

a plurality of lens layers disposed over the plurality of light emitting element layers;

an intermediate layer disposed to cover the plurality of light emitting element layers, the intermediate layer including an encapsulation layer disposed between the plurality of light emitting element layers and the plurality of lens layers, the encapsulation layer including a first inorganic encapsulation film, a second inorganic encapsulation film and an organic encapsulation film disposed between the first inorganic encapsulation film and the second inorganic encapsulation film, and the intermediate layer further including an insulation layer disposed between the lens layer and the encapsulation layer;

a plurality of touch electrodes having a mesh shape and the plurality of lens layers each having a convex shape, both of the plurality of touch electrodes and the plurality of lens layers being directly disposed on a same surface of the insulation layer;

a lens protecting layer disposed on the insulation layer and covering one lens layer of the plurality of lens layers;

a first dam disposed in the non-display area and configured to surround the organic encapsulation film; and a second dam disposed in the non-display area and configured to surround the lens protecting layer, wherein a total reflection of light output from a light emitting area of one light emitting element layer of the plurality of light emitting element layers does not occur on an interface between the one lens layer and the lens protecting layer, wherein a refractive index of the lens layer is higher than a refractive index of the organic encapsulation film in the encapsulation layer, and the refractive index of the organic encapsulation film is higher than a refractive index of the lens protecting layer, wherein the refractive index of the lens layer is 1.8 and the refractive index of the lens protecting layer is 1.3, wherein a transistor is disposed below the plurality of light emitting element layers, and wherein the first dam and the second dam are disposed in different layers so as to overlap each other in an upward and downward direction.

* * * * *